United States Patent [19]
Korte et al.

[11] Patent Number: 6,124,758
[45] Date of Patent: Sep. 26, 2000

[54] RF POWER AMPLIFIER CONTROL SYSTEM

[75] Inventors: Theodore H. Korte, Hamilton, Ohio; Jeffrey M. Malec; Zhiqun Hu, both of Quincy, Ill.; Carlos Abascal, Middletown, Ohio; James P. Keller, Quincy, Ill.

[73] Assignee: Harris Corporation, Melbourne, Fla.

[21] Appl. No.: 09/136,637

[22] Filed: Aug. 19, 1998

[51] Int. Cl.⁷ .................................................... H03F 3/68
[52] U.S. Cl. ...................... 330/124 R; 330/295; 455/126
[58] Field of Search ........................... 330/124 R, 124 D, 330/84, 295, 2; 455/126

[56] References Cited

U.S. PATENT DOCUMENTS

| | | | |
|---|---|---|---|
| 5,111,166 | 5/1992 | Plonka et al. | 333/128 |
| 5,126,704 | 6/1992 | Dittmer et al. | 330/295 |
| 5,206,604 | 4/1993 | Vaninetti | 330/124 R |
| 5,500,626 | 3/1996 | Barclay et al. | 330/2 |
| 5,561,395 | 10/1996 | Melton et al. | 330/124 R |
| 5,781,066 | 7/1998 | Parisi et al. | 330/124 R |

*Primary Examiner*—Robert Pascal
*Assistant Examiner*—Khanh Van Nguyen
*Attorney, Agent, or Firm*—Tarolli, Sundheim, Covell, Tummino & Szabo L.L.P.

[57] ABSTRACT

An RF power amplifier control system is presented herein. The system includes a group of power amplifier modules for amplifying an RF signal. Each group includes first and second group controllers for, when on, controlling the operation of the power amplifier modules including turning on and turning off each of the modules within the group. The first group controller is normally on for controlling the amplifier operation and the second group controller is turned on for controlling the operation only when the first controller is turned off. First and second central controllers are provided for, when on, controlling the operation of the first and second group controllers. The first central controller is normally on to provide the control operation and the second central controller monitors the operation of the first controller and performs the control operation in the event that the first central controller malfunctions.

64 Claims, 13 Drawing Sheets

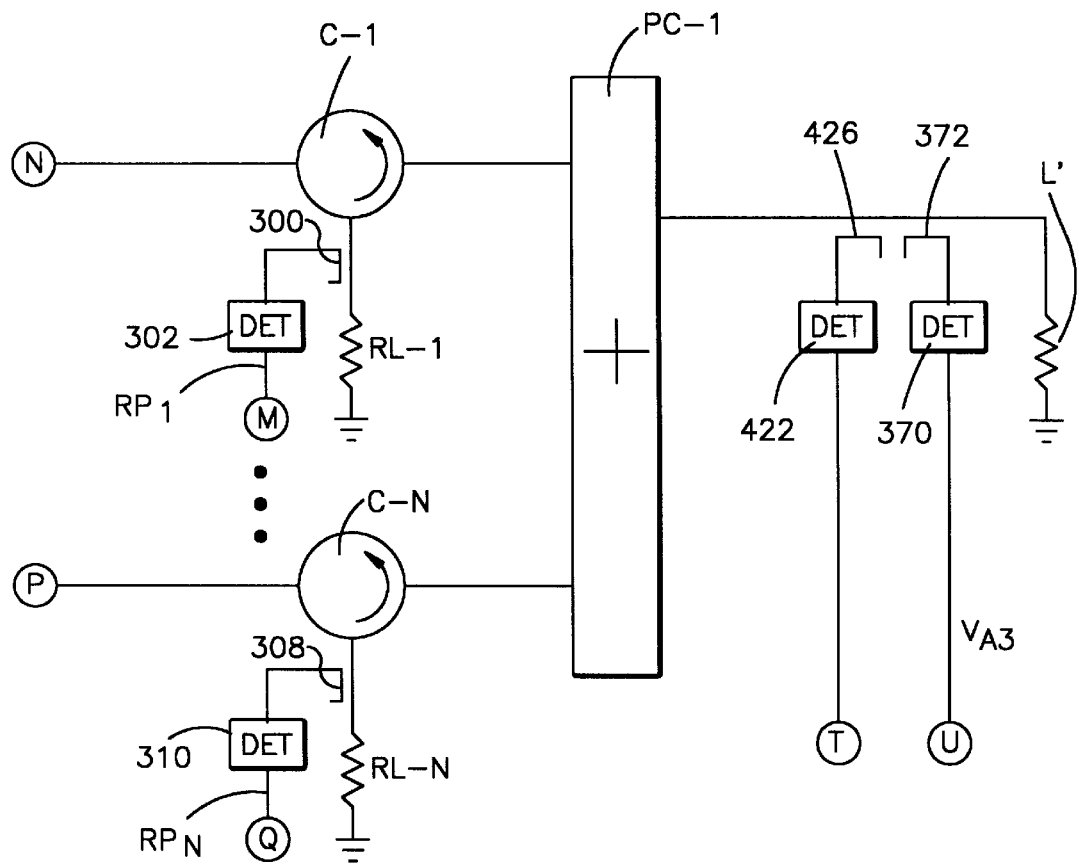
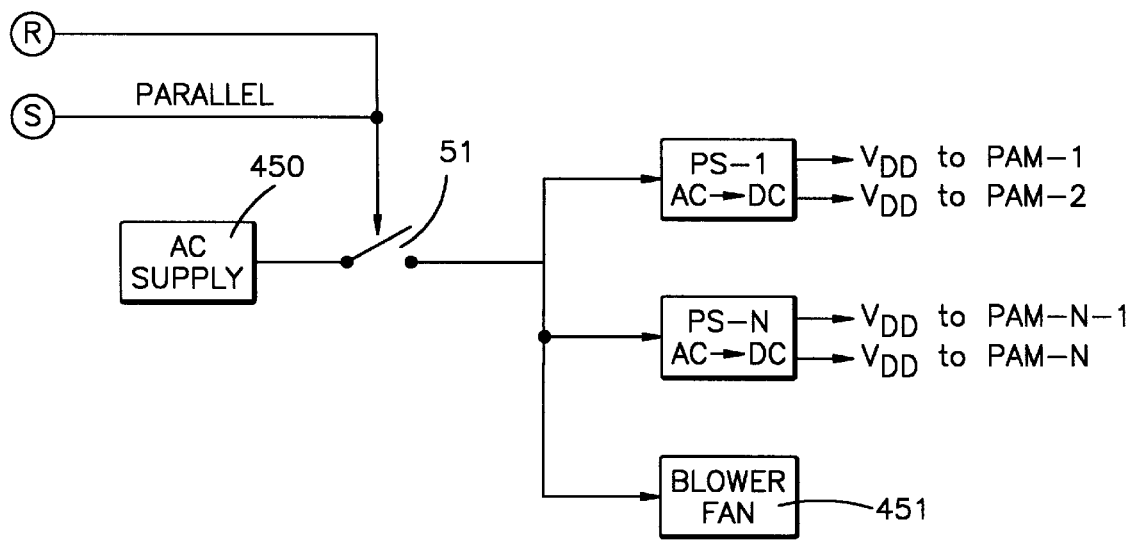
Fig.2B

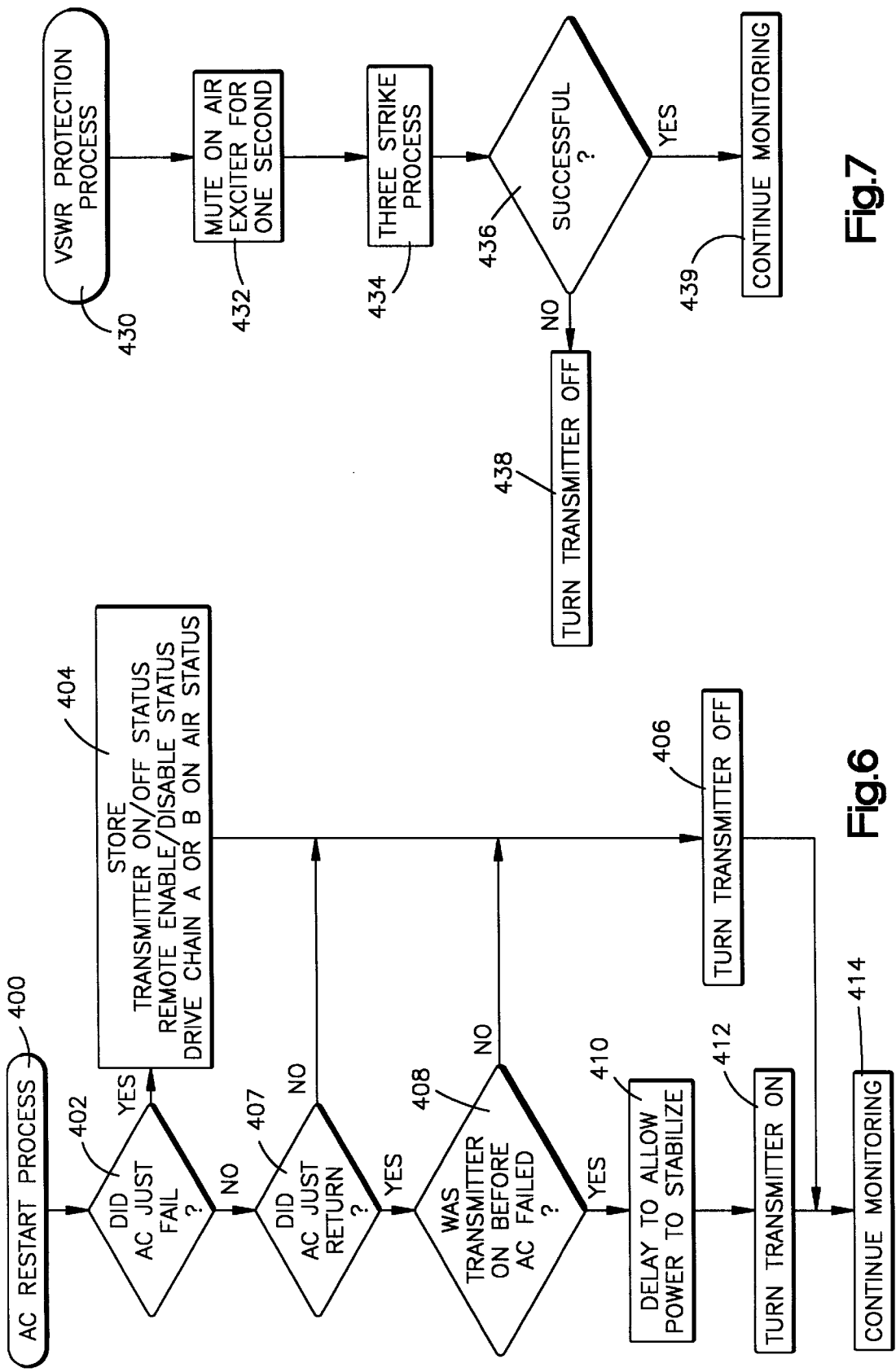

RF POWER AMPLIFIER CONTROL SYSTEM

TECHNICAL FIELD

The present invention is directed to an RF power amplifier control system for use in controlling the amplification of an RF signal.

BACKGROUND OF THE INVENTION

RF power amplifiers are known in the art for use in amplifying RF signals for broadcasting purposes, including radio and television. These amplifiers may be employed for broadcasting either analog television signals, known as the NTSC format, or digital signals, known as the ATSC format.

In the amplification of such RF signals, it is common to split the RF signal to be amplified into portions and then amplify each portion and combine the amplified portions to provide an amplified RF signal for application to an antenna system.

The known methods of splitting and combining the RF signals take place at both a module level and a group (of modules) level. That is, a plurality of power amplifier modules may be grouped together and housed in a common power amplifier cabinet. The group (or cabinet) may receive an RF signal which is then split into portions and each portion is fed to one power amplifier module for amplification. The amplified RF signals from the modules are combined.

Such an amplifier system may have several such groups of power amplifier modules housed in several different power amplifier cabinets. An RF signal which is received by the system is split into portions with each portion being fed to the group of power amplifiers housed within one of the power amplifier cabinets. Again, within each group the RF signal is split into portions with each portion being supplied through one of the groups of power amplifier modules for amplification. The outputs from the various groups are then combined and fed to an antenna system.

As an example, the system as described above may include one to five power amplifier groups (or cabinets) with each group containing 16 power amplifier modules and each module containing 12 power amplifiers. The RF output signals from each module may be on the order of 400 watts. Consequently, each cabinet may provide an RF output on the order of 5,000 watts and a system of five cabinets may provide an RF output on the order of 25,000 watts.

Transmitters that employ RF power amplifiers as described above are frequently expected to be constantly operating or continuously "on the air" even though equipment failures take place. Some equipment failures are of a type referred to as a "single point failure". Such a failure in some prior art transmitter systems has resulted in transmitter shut-down. For example, in a transmitter employing an IOT (inductive output tube) the amplification takes place in a single vacuum tube. If the tube fails, the transmitter is shut down and, hence, is "off the air".

It is desirable that equipment failures do not result in a transmitter shutting down and being "off the air". To this end, it is desired to provide a system exhibiting a great amount of redundancy of equipment and functional control so that there is a backup or a work-around for each potential single point failure situation in order to keep the transmitter "on the air". It is also desirable to provide "on air" serviceability of components. Many of such components may be "hot pluggable" in the sense that they may be removed and replaced without shutting off the power.

It is also desirable that the controls for the power amplifier system include two control systems which work in parallel and wherein each is capable of operating the power amplifier system with one control system serving as the normal or main control system and the other control system serving as a back up or life support control system.

SUMMARY OF THE INVENTION

In accordance with one aspect of the present invention, the system includes an input signal source for providing an input signal and an exciter for receiving the input signal and providing therefrom an RF signal. At least one group of power amplifier modules is provided wherein each module amplifies a portion of the RF signal. Each group has first and second group controllers which, when on, serve to control the operation of each of the power amplifier modules within the group. This includes turning on and off each of the modules within the group. The first group controller is normally turned on for controlling the amplifier operation and the second group controller is turned on for controlling the operation when the first group controller malfunctions. Additionally, this system includes first and second central controllers, each of which serves, when on, to control the operation of the first and second group controllers. The first central controller is normally turned on to perform the control operations and the second central controller monitors the operation of the first central controller and becomes operative upon a malfunction of the first central controller for performing the control operation.

BRIEF DESCRIPTION OF THE DRAWINGS

The foregoing and other advantages of the invention will become more readily apparent from the following description of the preferred embodiment of the invention as taken in conjunction with the accompanying drawings, which are a part hereof, and wherein:

FIGS. 2A and 2B is a schematic-block diagram of power amplifier control circuitry in accordance with the invention;

FIG. 6 is another flow diagram illustrating another operation of the invention;

FIG. 7 is a still another flow diagram illustrating another operation of the invention.

DESCRIPTION OF PREFERRED EMBODIMENT

Figure 1A:
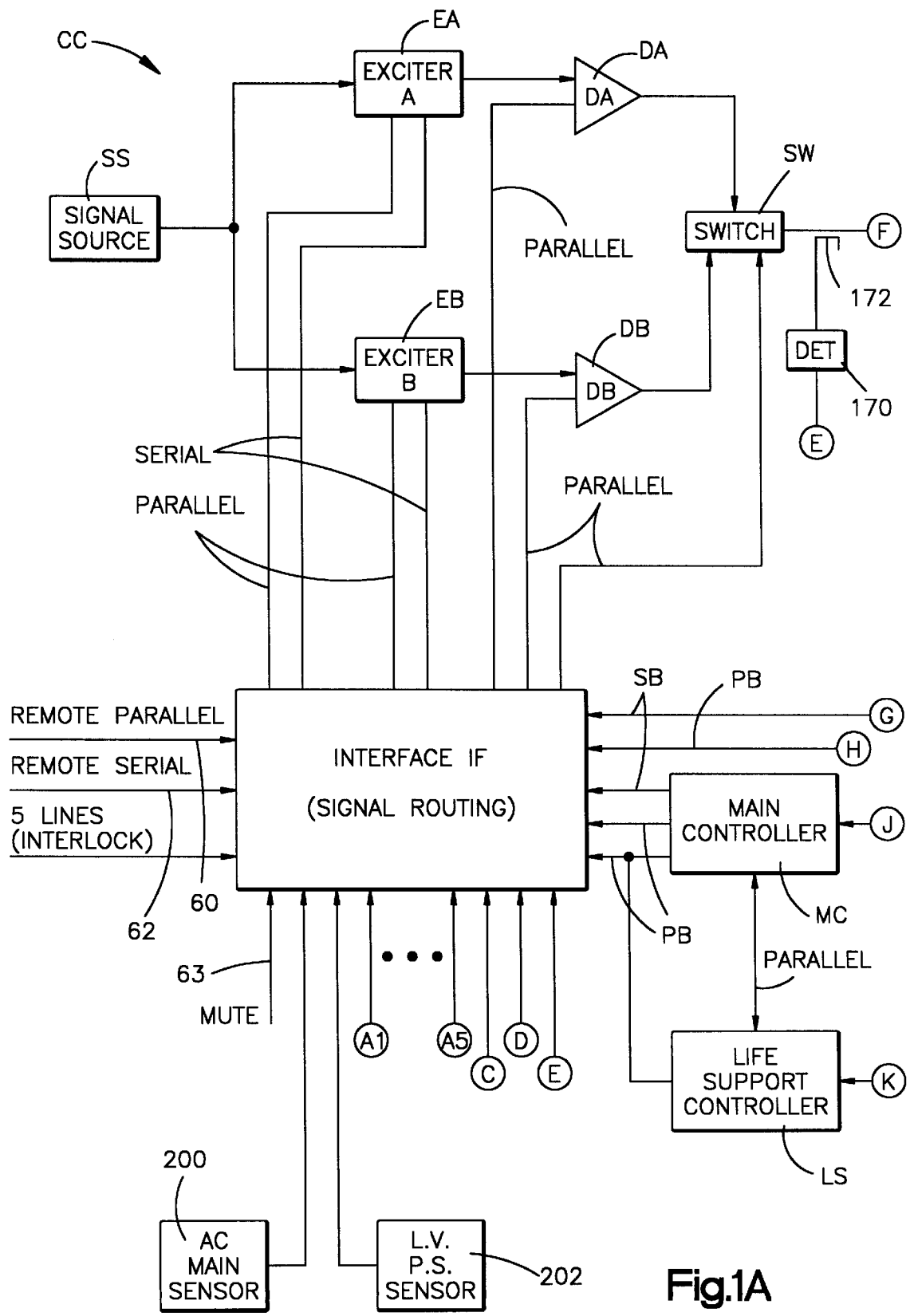
FIGS. 1A and 1B is a schematic-block diagram illustration of apparatus employed in one embodiment of the invention.
Figure 1B:
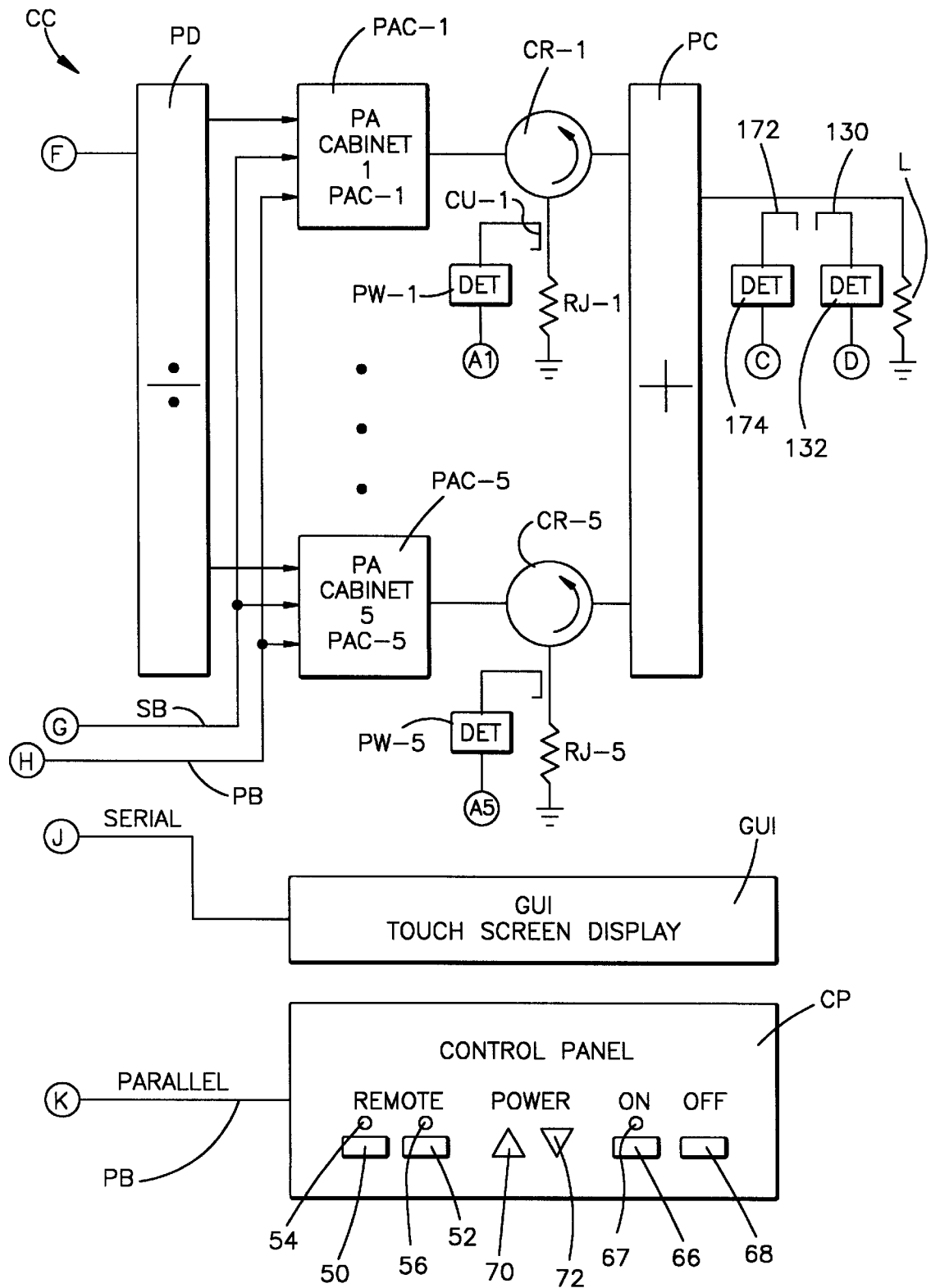

Reference is now made to FIG. 1 which illustrates an RF power amplifier control system which includes a control cabinet CC that receives an input signal from a signal source SS and supplies therefrom an RF signal to RF power amplifiers located in groups in respective power amplifier cabinets PAC-1 through PAC-5. The RF signals are combined in a power combiner PC and the combined RF output signal is applied to a load L, which includes an antenna system for broadcasting the amplified RF signal.

The signal source SS may be an analog source for providing analog television signals in the NTSC format or a digital source for providing digital television signals in the ATSC format. In the embodiment illustrated, the input signals from the signal source SS are digital signals that carry multiplexed audio, video and data. These signals are applied to a pair of exciters EA and EB. The exciters are identical and each generates a DTV signal known as an 8-VSB modulated RF signal. Each exciter can take the form as model CD1A available from the Harris Corporation. The RF signal supplied by each exciter has a frequency bandwidth of 6 MHz (the bandwidth of a television channel). This signal is carried by an RF carrier within the UHF frequency range from 470 to 860 MHz.

The RF signals from exciters EA and EB are amplified by driver amplifiers DA and DB that provide amplification from approximately 20 milliwatts to approximately 2 watts. The amplified RF signals are supplied to a switch SW which is controlled, as will be described hereinafter, to select one of the RF signals for further amplification. The RF signal to be amplified is then supplied to a power divider PD which splits the RF signal into five equal portions with each portion being supplied to one of five power amplifier cabinets PAC-1 through PAC-5. Each power amplifier cabinet takes the form of cabinet PAC-1 shown in FIG. 2. This cabinet includes a group or plurality of power amplifier modules PAM-1 through PAM-N, where N, for example, may be sixteen. The output RF signal from each cabinet may be on the order of 5 kW. These signals are combined at the power combiner PC (FIG. 1) to provide a combined output RF signal having a power on the order of 25 kW for application to the load L.

Figure 2A:
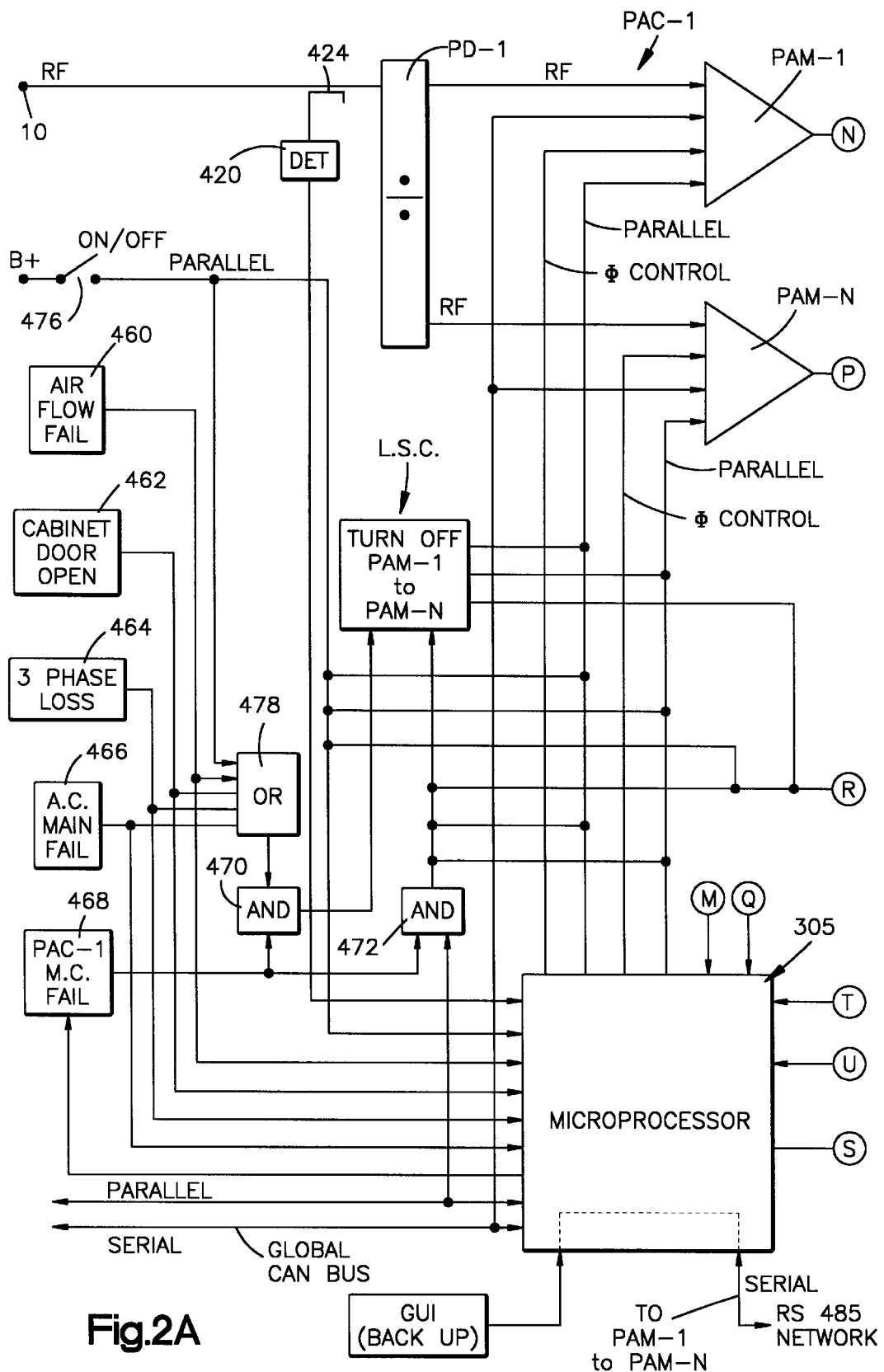

Each of the power amplifier cabinets PAC-1 through PAC-5 in FIG. 1 takes the form of the power amplifier cabinet PAC-1 in FIG. 2 to which attention is now directed. A portion of the RF signal received from the power divider PD in FIG. 1 is received at input terminal 10. This signal is supplied within the power amplifier cabinet PAC-1 to another power divider PD-1 wherein the RF signal is split or divided into N portions. In the embodiment being illustrated N is equal to 16. Each of these portions is applied to one of N power amplifier modules PAM-1 through PAM-N. The power input to each power amplifier module is on the order of 20 milliwatts and the output power is on the order of 350 watts. These amplified RF signals are then applied to a power amplifier combiner PC-1 wherein all N RF signals are combined so that the combined output RF signal has a power level on the order of 5 kW. This combined RF signal is supplied to a load L'.

Figure 3:
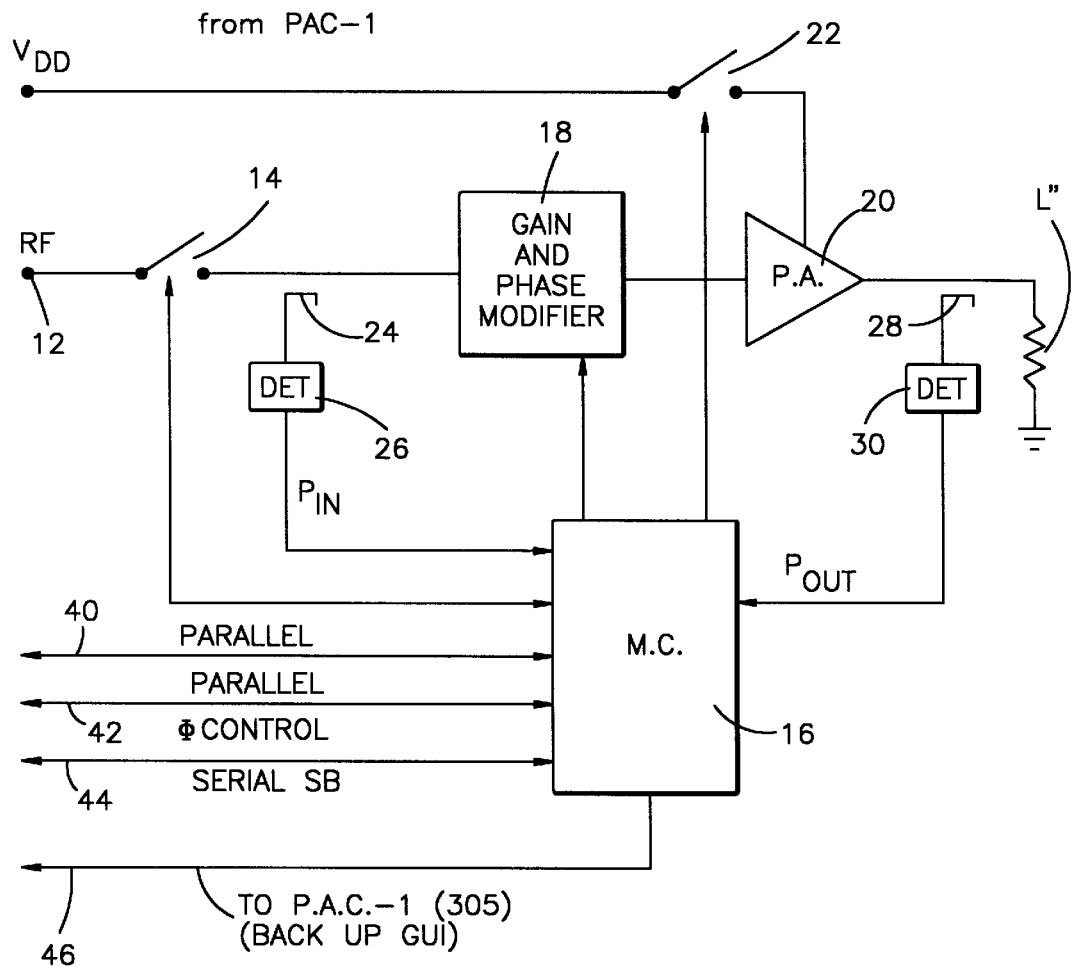
FIG. 3 is a schematic-block diagram illustration of a power amplifier module employed in the invention.

Each of the power amplifier modules PAM-1 through PAM-N in FIG. 2 takes the form of the power amplifier module PAM-1 shown in FIG. 3 to which attention is now directed. The portion of the RF signal obtained from the power divider PD-1 in FIG. 2 is supplied to an input terminal 12 and the signal is passed by an RF switch 14, when closed under control of a microprocessor 16 within the power amplifier module. The signal is then applied to a phase and gain modifier 18 wherein the phase and gain of the signal may be adjusted by the microprocessor 16. The modified RF signal is then supplied to a power amplifier 20. The power amplifier 20 amplifies the RF signal, when a DC switch 22 is closed under control of the microprocessor 16. The amplified signal from the power amplifier 20 is then supplied to a load L". In practice, the power amplifier PA 20 may include several power amplifiers all operating in parallel with each amplifying a portion of the RF signal supplied to the power amplifier module.

The power amplifier module PAM-1 includes an input signal coupler 24 which is connected to a power detector 26 which provides an output voltage signal representative of the average input power. Also, another coupler 28 is connected to the output circuit and is connected to a power detector 30 which provides an output signal representative of the average output power. The signals representative of the average input power and the average output power are supplied to the microprocessor 16 which, depending on the values of the signals, will control the phase and or the gain of the RF signal. The power amplifier module PAM-1 communicates with the power amplifier cabinet by way of a parallel buses 40 and 42 and serial buses 44 and 46. The parallel buses each refer to a bus having several parallel signal lines each of which is dedicated to provide a specific control signal, such as turn ON or turn OFF, etc. The serial buses carry serial information (data) between the microprocessor 16 and a microprocessor at the power amplifier cabinet or at the main controller.

Control Systems

The control for operating the power amplifier system includes two control systems working in parallel in a distributed architecture. A first control system is referred to herein as the main control system and this system normally provides operating control. The second system is a back up control system and is sometimes referred to herein as the life support control system and provides operating control when the main control system malfunctions.

The main control system is microprocessor based and includes a main or central controller MC which includes a microprocessor (sometimes referred to herein as a microcomputer). Additionally, the main control system includes a serial bus SB and which takes the form as a controller area network (CAN) serial bus. The main and life support controllers are interconnected with exciters EA and EB by way of an interface IF that serves to provide signal routing only. The main controller also communicates by way of the serial bus SB with the various power amplifier cabinets PAC-1 through PAC-5. The main controller also communicates with a graphic user interface GUI by way of a serial bus. The GUI includes a video display for displaying various control parameters, such as power in and power out and the like. The GUI also includes a touch screen display that mimics a control panel CP to be described below.

The backup control system or life support control system includes a discrete I/O parallel interconnect bus PB and is discrete logic based. Thus, the life support system includes a second central or life support controller LS which is made up of discrete logic components and this controller functions in accordance with the flow diagrams of FIGS. 5 to 8. All communication with the life support controller LS is by way of a parallel bus PB. The life support controller communicates with a control panel CP by way of the parallel bus. This control panel is located in the control cabinet CC. The control panel CP permits amplifier control operation by the life support system when the main control system is not operating. This control panel CP includes a remote control enable switch 50 and a remote control disable switch 52. Light emitting diodes 54 and 56 are respectively associated with switches 50 and 52. If the remote enable switch 50 is actuated, the light emitting diode 54 is energized and this signifies that the system may be controlled from a remote location as by a remote parallel bus 60 or a remote serial bus 62. These buses are connected by way of the interface IF with the control system parallel and serial buses.

If the operator actuates the remote control disable switch 52 the disable light is turned on and this signifies that operation of the control system is by an operator at the control cabinet and not from a remote location. If the operator uses the control panel CP for operation, the transmitter may be turned on by actuating the transmitter ON switch 66 which causes an ON light-emitting diode 62 to be energized. The transmitter may be turned off by the operator actuating an OFF switch 68.

The operator using the control panel CP may increase (or raise) the power level of the exciters by depressing a button 70 or may lower the power to the exciters by depressing a button 72. The life support controller LS communicates with the exciters A and B by way of the parallel bus and the signal routing provided by the interface IF.

The operator may turn this transmitter on by actuating the ON switch 66 which sends an ON command to drivers DA and DB and energizes light emitting diode 67. When the operator actuates the transmitter OFF switch 68, an OFF command is sent to drivers DA and DB.

The power control system may receive commands and data from a remote location by way of the remote parallel bus 60 and the remote serial bus 62. Turn ON and turn OFF commands may be received by the parallel bus 60 and be routed by way of the interface IF to turn on drivers DA and DB and to select which exciter output will be effective by operating the switch SW. Other data may be supplied by way of the serial bus 62 which interfaces with the control system serial bus SB by way of the interface IF.

Parallel Bus

The parallel bus PB may have a specific number of control lines for carrying different commands or status conditions. In the embodiment being illustrated there are 12 dedicated lines that make up the parallel bus. These 12 dedicated lines include two lines for ON and OFF commands which may be used to turn ON or turn OFF the drivers DA and DB as well as to turn on or off the power amplifier modules in the various power amplifier cabinets PAC-1 through PAC-5.

Additionally, the parallel bus includes five lines for AC failure conditions. This is information that is sent by each of the five cabinets PAC-1 through PAC-5 to the control cabinet CC (FIG. 1). Each dedicated line may carry a signal that represents a failure status of its associated power amplifier cabinet. Another five dedicated lines provide interlock (safety) commands that are received from an external source, such as the owner of the transmitter equipment. These interlocks are directed to one of the five cabinets PAC-1 through PAC-5.

Mute Control

Another dedicated line from a remote location is the mute control line 63 by which a remote mute command can be directed through the interface IF to one of the parallel lines to exciters A and B for muting the exciters.

Detectors

Figure 4:
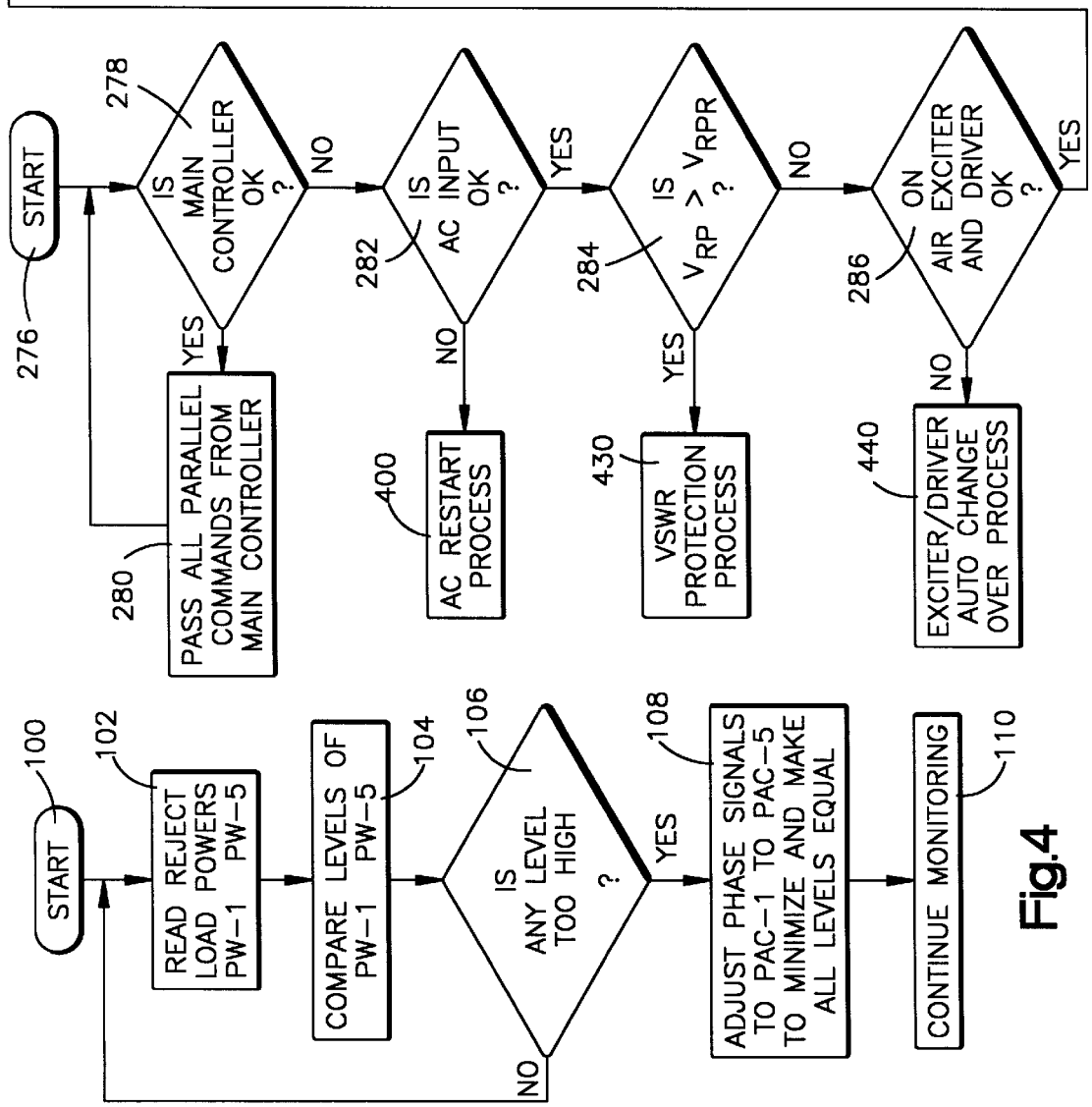
FIG. 4 is a flow diagram illustrating an operation of the invention.

The outputs of the power amplifier groups or cabinets PAC-1 through PAC-5 are supplied to the power combiner PC. These circuits include reject loads RJ-1 through RJ-5 which are respectively connected to circulators CR-1 through CR-5. These reject loads are monitored to determine whether the output power provided by the various power amplifier cabinets are unequal. This is detected by employing reject load sensing couplers CU-1 through CU-5 respectively associated with the reject loads RJ-1 through RJ-5. These couplers are connected to power detectors PW-1 through PW-5 which provide output signals representative of the average power at these reject loads. This data is supplied by way of the interface IF to the microprocessor located in the main controller MC. This microprocessor is programmed to receive and analyze the signals provided by the power detectors PW-1 through PW-5 and then provide phase adjustments as needed. The microprocessor performs these functions in accordance with the flow diagram of FIG. 4 to which reference is now made.

The reject load routine at the cabinet microprocessor may be referred to as routine 100 and includes a step 102 wherein the reject load power levels detected by detectors PW-1 through PW-5 are read. These power levels are then compared at step 104 and the procedure advances to step 106. At step 106, a determination is made as to whether any level is too high. If so, the procedure advances to step 108 during which the microprocessor adjusts the phase control signals to the power amplifier cabinets PAC-1 through PAC-5 to minimize and make all of these reject power levels equal. The procedure then advances to step 110 where the monitoring function is continued.

Reflected Power

A reflected power sensor includes a signal coupler 130 which couples a sample of the reflected power from the load L to a detector 132 that provides an output signal $V_{RP}$ representative of the reflected power (VSWR indication). This signal is supplied to the microprocessor in the main controller MC where the signal is compared with a reference to see if the reflected power is too high. The procedure involved is discussed hereinafter with reference to the flow diagrams for the operations of the master controller MC.

Input and Output Power Detection

An input power detector 170 is connected to a signal coupler 172 and serves to provide an output signal representative of the average input power. This signal is supplied to the interface IF so that the input power may be displayed on the GUI. Similarly, the output power is detected with a detector 174 connected to a signal coupler 172 to obtain a signal representative of the average output power. This is supplied to the interface IF for a display on the GUI.

AC Main Sensor and L.V.P.S. Sensor

At the cabinet level, there is provided an AC main sensor 200 which senses a fault in the AC supply and provides a signal representative thereof to the interface IF. Additionally, there is provided a low voltage power supply sensor 202 which senses for a fault in the low voltage power supply. Such a fault signal from sensor 200 will cause the transmitter to be turned off. These fault signals are supplied by way of the interface IF to both the main controller and the life support controller (which will shut down the transmitter if the main controller is not operating). The transmitter is turned off by either main controller or the life support controller by muting the exciters EA and EB, turning off the drivers DA and DB, and opening the AC supply switch 51 at each cabinet. The status of the transmitter just prior to the failure condition is noted and stored in the microprocessor at the main controller MC. The ON or OFF condition, which exciter/driver pair is providing the RF signal, and whether the system is operating in remote enabled or remote disabled status constitutes information that is stored at the life support controller by way of suitable latching relay means.

Life Support Controller

The second central backup or life support controller LS is preferably a discrete logic based control system and serves as a backup for the first central or main controller MC which is microprocessor based. The life support system could also be microprocessor based but the preferred implementation is discrete logic components. The functions performed by the life support controller LS may be represented as with a logic diagram similar to that of a flow diagram showing the manner in which a microprocessor is programmed. These diagrams for the life support controller are illustrated in FIGS. 5–8 to which attention is now directed.

Figure 5:
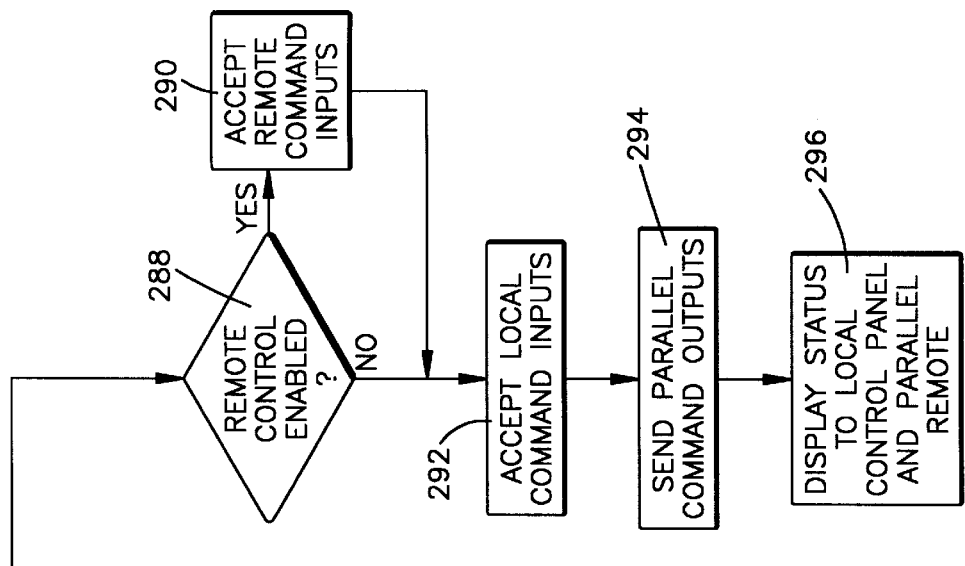
FIG. 5 is another flow diagram illustrating an operation of the invention.

The life support routine for control at the control cabinet CC (FIG. 1) is illustrated as routine 276 in FIG. 5. In step 278, a determination is made as to whether the main controller MC in FIG. 1 is operating properly. One of the parallel lines connecting the main controller to the life support controller is a watch dog line and this line is raised if a failure takes place in the microprocessor at the main controller. If the watch dog line is not raised, then the main controller is operating properly and the procedure advances to step 280 during which the life support controller passes all parallel commands from the main controller MC. If the main controller is not operating properly the procedure advances to step 282 at which a determination is made as to whether or not the AC input signal is proper. This is obtained with sensor 200 in FIG. 1 which supplies a fault signal when the AC input is not operating properly. If a fault signal has been noted, the procedure advances to AC restart process 400 to be described hereinafter with reference to FIG. 6. If the AC input is proper, the procedure advances to step 284.

In step 284, a determination is made as to whether the average reflected power $V_{RP}$ obtained from detector 132 exceeds a reference $V_{RPR}$. If it does, the procedure advances to a VSWR protection process 430 to be described hereinafter with reference to FIG. 7. If not, the procedure advances to step 286 where a determination is made as to whether the "on air" exciter and driver are operating properly. As will be noted from FIG. 1, parallel dedicated lines extend from drivers DA and DB through the interface IF to the life support controller LS. These dedicated lines provide information as to the status including the ON or OFF status of each driver. Also, dedicated parallel lines extend from the switch SW through the interface IF to the life support controller LS to provide status information as to whether the selected exciter is exciter EA or EB for the "on air" operation. If the selected "on air" exciter and driver are operating properly, the procedure advances to step 288 and if not, the procedure advances to an exciter/driver automatic change over process 440 to be described hereinafter with reference to FIG. 8.

In step 288, a determination is made as to whether the remote control has been enabled. If switch 50 has been actuated by the operator, the remote control has been enabled and this information is passed by the parallel bus to the life support controller LS. If the remote control has been enabled, the procedure advances to step 290 wherein the life support system accepts remote command inputs such as from the remote parallel bus 60. The procedure then advances to step 292 during which the life support controller accepts local command inputs, such as from the control panel CP, and advances to step 294 during which the controller sends parallel command outputs. The procedure advances to step 296 during which the various status lights are energized such as the light emitting diodes 54, 56 and 67, as appropriate.

The AC restart process 400 noted in FIG. 5 is illustrated in FIG. 6 to which attention is now directed. In step 402, a determination is made as to whether the AC input just failed. This is done by determining if the failure took place within a time period $\Delta T_1$ prior to the decision to be made at step 402. If it did, then suitable latch memory means are employed for storing the transmitter ON or OFF status, the remote enable or disable status and which exciter EA or EB was "on the air" at the time of the failure. This is all done in step 404 and then the procedure advances to step 406 during which the transmitter is turned off by supplying an OFF command to the drivers DA and DB, an OFF command to the power amplifier cabinets including opening the master switch 51 at each cabinet and opening the RF switch 14 and the DC switch 22 in each power amplifier module.

If the decision at step 402 was negative, the procedure advances to step 407 at which a determination is made as to whether the AC input signal has just returned within a time frame of $\Delta T_2$ before making this decision. If not, the transmitter is turned off at step 406.

If the answer is yes in step 407, the procedure advances to step 408 during which a determination is made as to whether the transmitter was on before the AC input signal failed. If not, the transmitter is turned off at step 406 and if the answer is yes, the procedure advances to step 410 which provides a time delay $\Delta T_3$ to allow the AC power to stabilize. Thereafter, in step 412, the transmitter is turned on by forwarding an ON command to the exciters DA and DB and an ON command to each of the power amplifier cabinets. This includes closing the master switch 51 in each cabinet and closing switches 14 and 22 in each of the power amplifier modules. Thereafter, the procedure advances to step 414 wherein the controller continues its monitoring function.

The VSWR protection process 430 noted in FIG. 5 is illustrated in detail in FIG. 7 to which attention is now directed. Since a determination was made in step 284 (FIG. 5) that the reflected power signal $V_{RP}$ is greater than the reference signal $V_{RPR,}$ the procedure advanced to the protection process. In step 432, the controller mutes the "on air" exciter for one second. The controller is made aware of which exciter is "on air" from the dedicated parallel lines that communicate with the switch SW. The controller, in turn, supplies a mute command to the exciter that was on the air for a time period of one second. Thereafter, the procedure advances to a three-strike process 434 which attempts to turn on the exciter three times during time spaced intervals within a 30 second time range to determine if the VSWR condition can be cleared. The procedure advances to step 436 which determines whether the three-strike process was successful and, if not, the controller provides a turn OFF command in step 438 to the transmitter and this is accomplished in the same manner as the turn transmitter OFF step 406 discussed hereinabove with reference to FIG. 6. If the procedure at step 436 was successful, the routine advances to step 439 and the monitoring function is continued.

Figure 8:
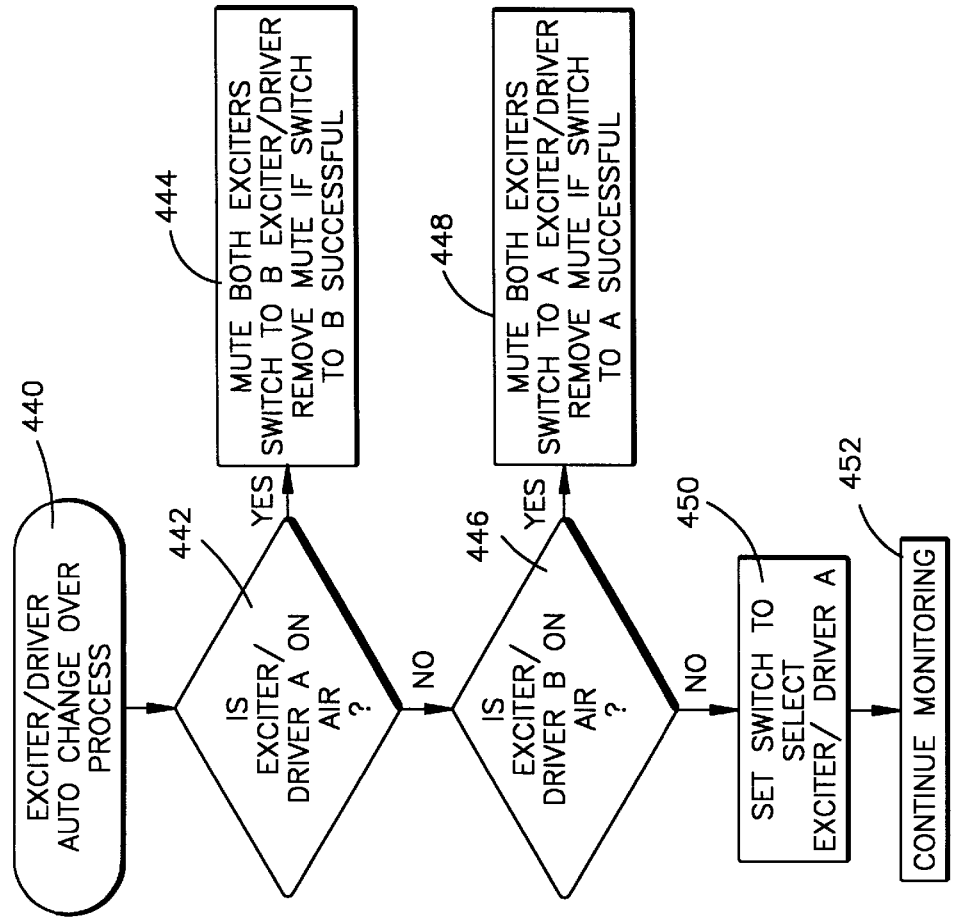
FIG. 8 is a still another flow diagram illustrating another operation of the invention.

The exciter-driver automatic change over process 440 noted in FIG. 5 is illustrated in greater detail in FIG. 8 to which attention is now directed. In this process, a determination is made at step 442 as to whether the exciter-driver A (EA and DA) is "on the air" when the determination was made at step 286 (FIG. 5) that the operation was not correct. If the determination was yes, then in accordance with step 444 the controller will mute both exciters EA and EB and switch the operation by way of switch SW for the exciter EB and its driver DB to be "on the air". If this is successful, the mute is removed.

If the determination at step 442 is negative, the procedure advances to step 446 during which a determination is made as to whether the exciter-driver B (EB and DB) is "on the air". If so, then in accordance with step 448 both exciters are muted and the operation is switched to having the exciter-driver A (EA and DA) being "on the air". If this switch is successful, the mute is removed.

If the determination in step 446 is negative, then the procedure advances to step 450 at which the switch SW is controlled to select the exciter-driver A (EA and DA) for the exciter that is "on the air". Thereafter, the procedure advances to step 452 and the monitoring process continues.

Main Controller Flow Diagram

The microprocessor MC in the first central or main controller is programmed to perform various functions as described herein. This programming is in accordance with the flow diagram FIGS. 9–13 to which attention is now directed.

Figure 9:
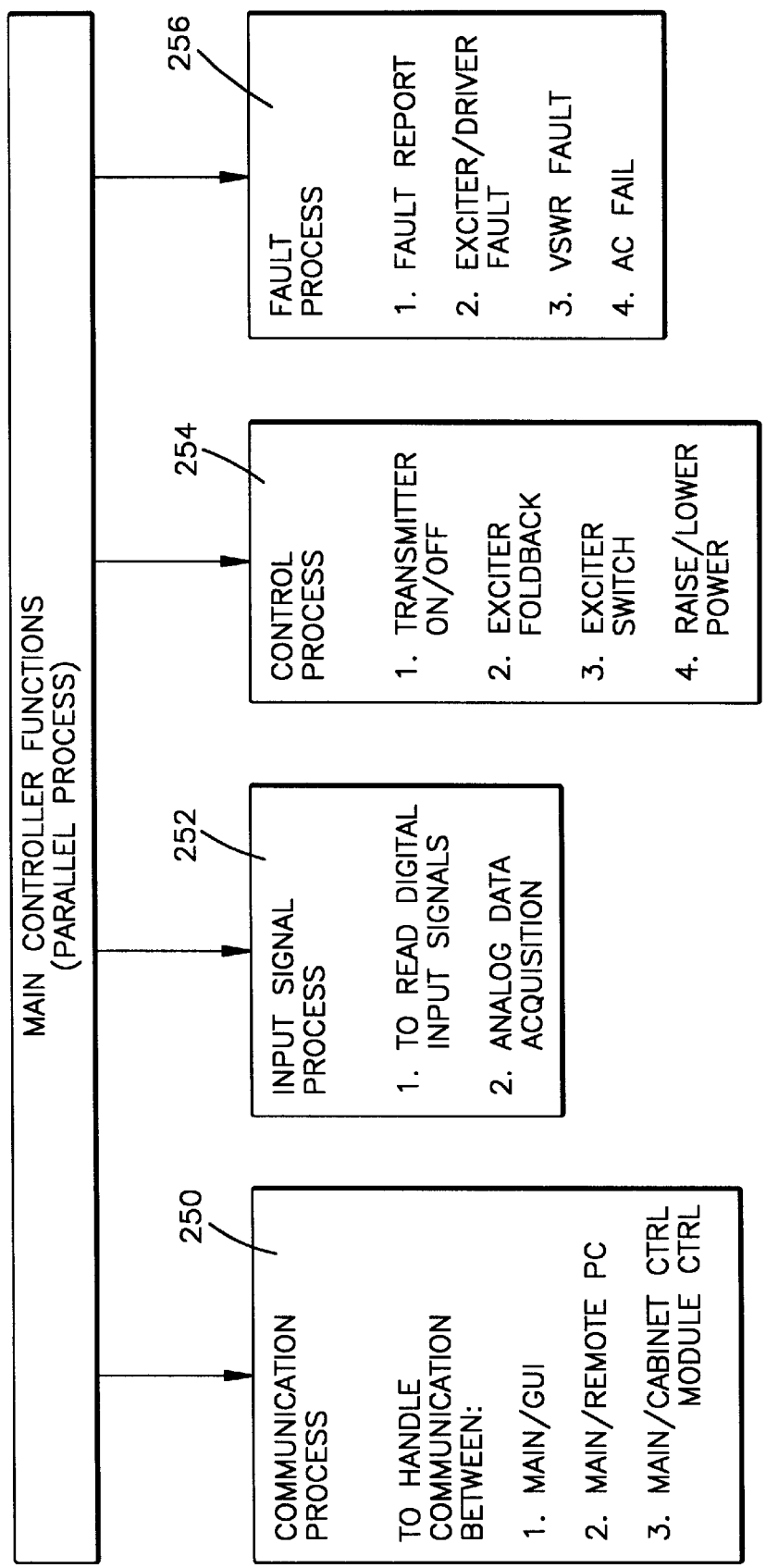
FIG. 9 is a still another flow diagram illustrating another operation of the invention.

Reference is now made to FIG. 9 which presents an overview of the functions performed by the main controller MC (FIG. 1). This microprocessor may take the form of 32 bit microprocessor known as model MC68376 from Motorola Corporation. Four parallel processes are performed by the main controller. These include a communication process 250, an input signal process 252, a control process 254, and a fault process 256. The communication process, as will be described in greater detail hereinafter, serves to handle communication between the main controller and the GUI, between the main controller and a remote device such as a personal computer and between the main controller and the amplifier cabinet controller or the module controllers. The input signal process 252 serves to read digital input signals and perform analog data acquisition. The control process 254 controls such functions as transmitter ON/OFF, exciter foldback, exciter selection switching operation and raising and lowering power to the exciters. The fault process 256 includes reporting faults, handling exciter-driver faults, VSWR faults and AC failure.

Communication Process

Figure 10:
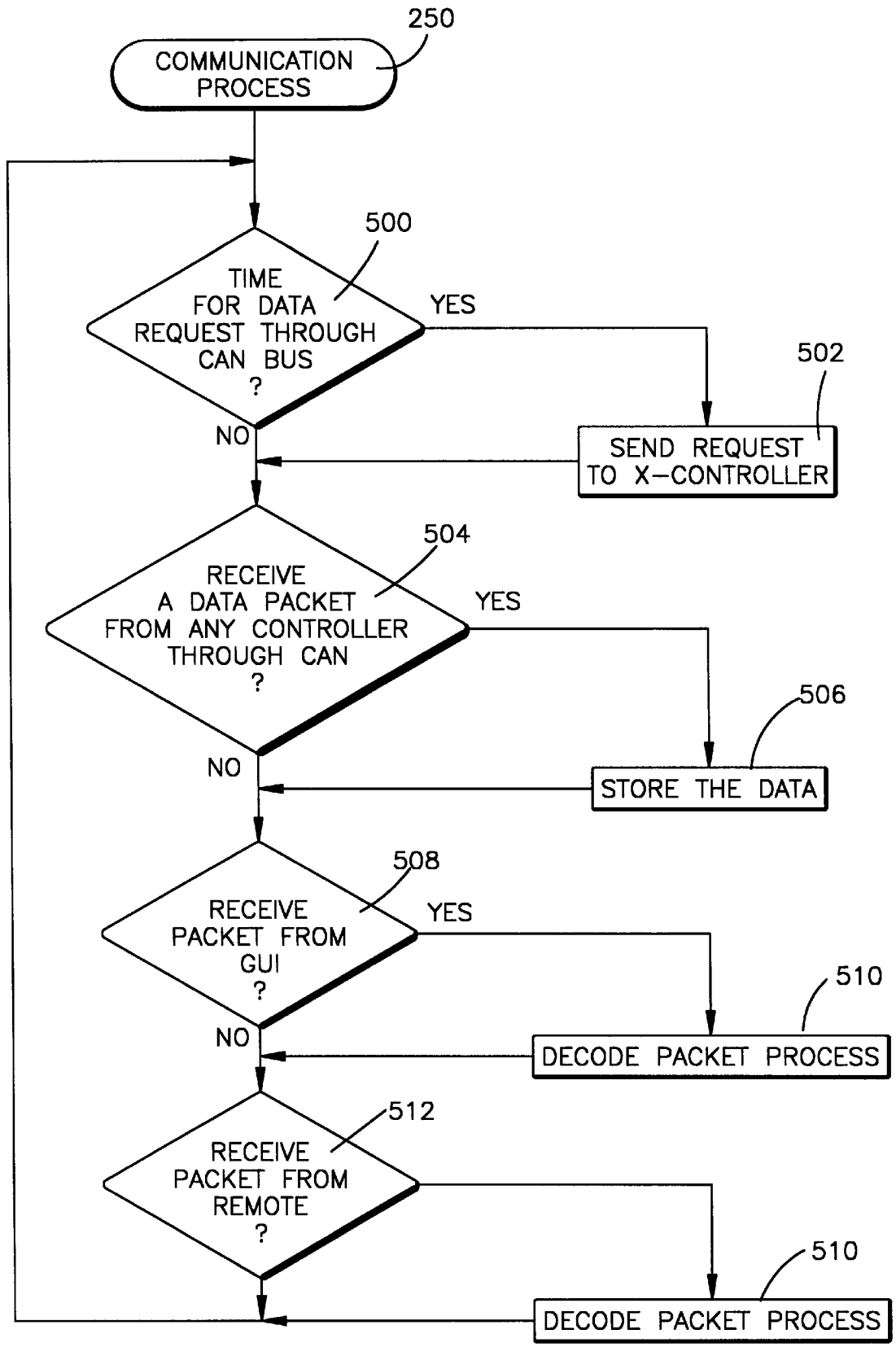
FIG. 10 is a still another flow diagram illustrating another operation of the invention.

Reference is now made to FIG. 10 which illustrates the communications process 250. At step 500, a determination is made whether it is time for the main controller to request data through the serial bus SB from various components. It is to be noted that the microcomputer periodically requests data in this manner. If it is time for a data request, the procedure advances to step 502 during which the main controller MC requests data from each of the various components (X controllers). This data is requested on the serial bus from the controller in each of the five cabinets or from the controller in each of the 80 power amplifier modules. It is to be noted that this communication between the main controller and the control cabinets CC and the power amplifier controllers and the power amplifier modules is by way of the CAN serial bus SB.

The procedure advances to step 504 during which the data requested, which is referred to herein as a data packet, is obtained from each controller by way of the serial bus. The procedure advances to step 506 during which the data is stored in memory of the microprocessor.

The procedure then advances to step 508 during which a determination is made as to whether the received packet of data is from the GUI. If so, the procedure advances to step 510 which is a decode packet process to be described in greater detail hereinafter with reference to FIG. 11. Thereafter, the procedure advances to step 512 during which a determination is made as to whether the data packet was received from a remote device, such as a personal computer. If so, the procedure advances to the decode packet process 510.

Decode Packet Process

Figure 11:
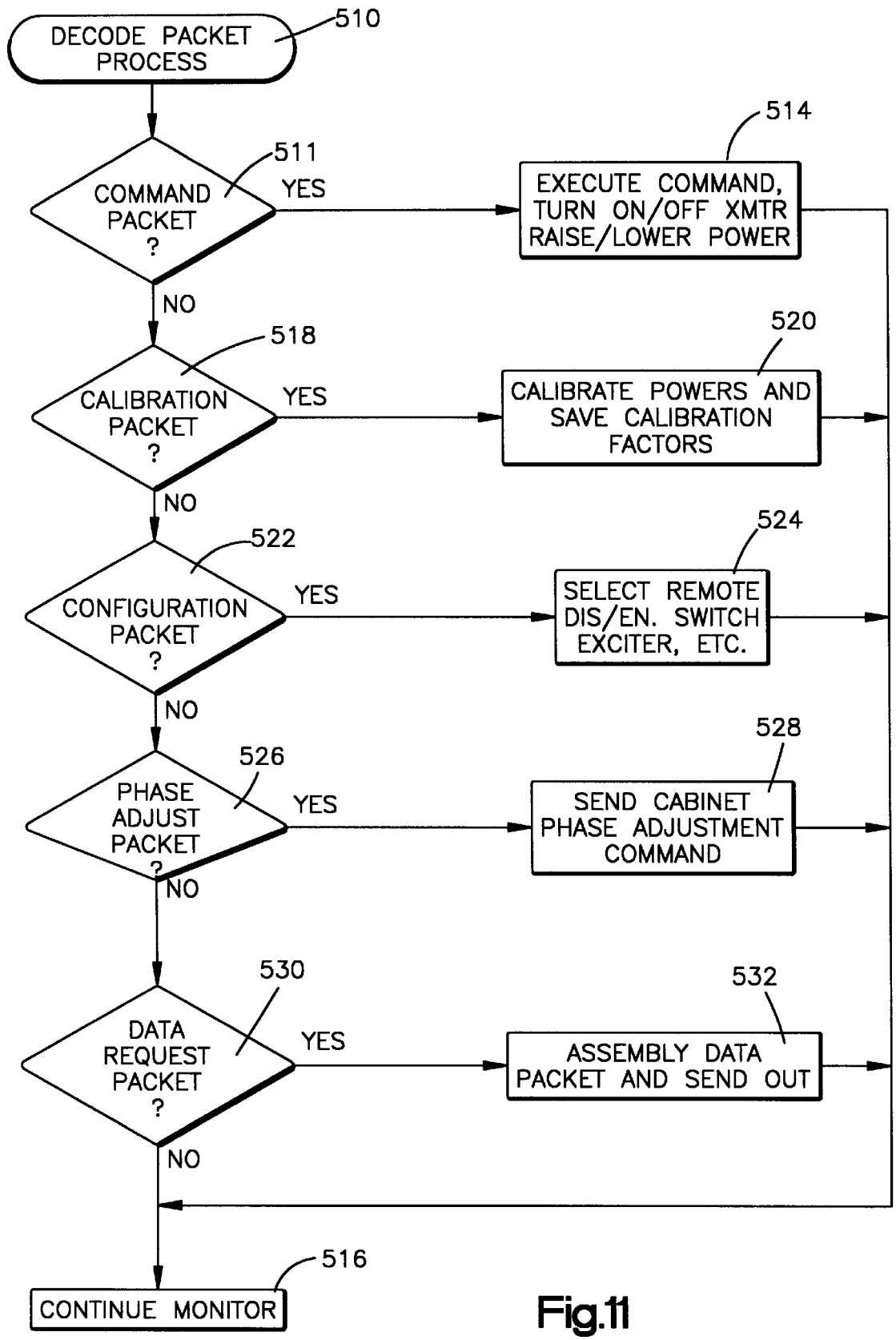
FIG. 11 is a still another flow diagram illustrating another operation of the invention.

The decode packet process 510 is illustrated in FIG. 11 to which attention is now directed. At step 511, a determination is made as to whether the packet is command data. If so, then in accordance with step 514 the commands are executed. That is, the transmitter is turned ON and OFF and the power to the exciters is either raised or lowered. Upon completion of step 514, the procedure advances to step 516 for continued monitoring.

If the packet was not command data, the procedure advances from step 511 to step 518 during which a determination is made as to whether or not the data represents calibration data. If so, the procedure advances to step 520 during which there is a calibration of powers and calibration factors are saved in memory and the procedure advances to step 516. If the packet was not a calibration packet in step 518, the procedure advances to step 522 during which a determination is made as to whether the packet is a configuration packet. If so, the procedure advances to step 524 during which a selection is made between remote enable and disable and whether the exciter operation is to be switched between exciter A and exciter B. Thereafter, the procedure advances to step 516.

If the packet was not a configuration packet, the procedure advances from step 522 to step 526 during which a determination is made as to whether the packet is a phase adjustment packet. If so, the procedure advances to step 528 during which phase adjustment commands are sent to the cabinet controllers.

If the packet is not a phase adjustment packet the procedure advances from step 526 to step 530 during which a determination is made as to whether the data packet was a data request packet. If so, the procedure advances to step 532 during which the data is assembled and sent to the requesting control and the procedure advances to step 516 to continue monitoring.

Fault Process

Figure 12:
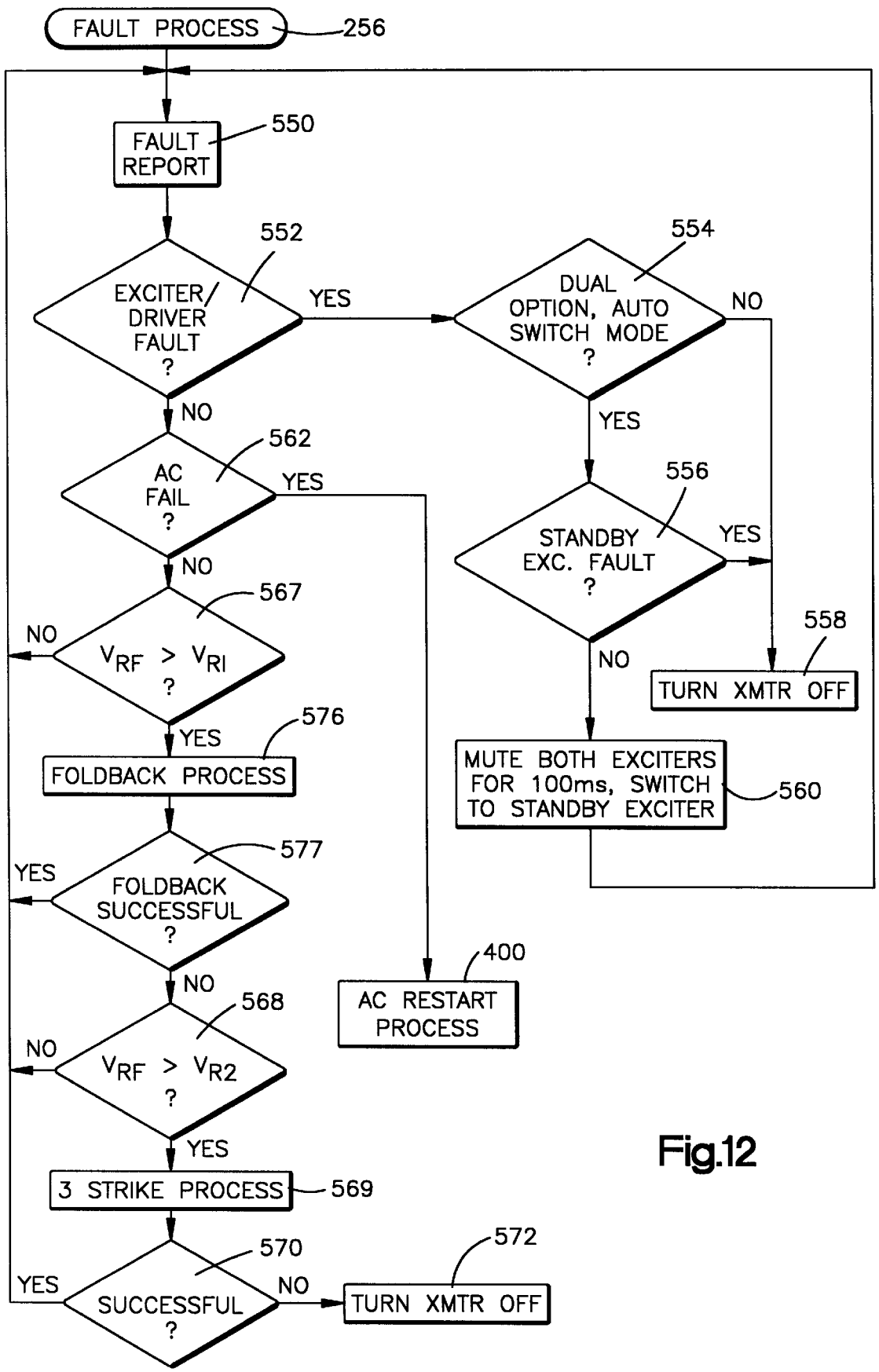
FIG. 12 is a still another flow diagram illustrating another operation of the invention.

The fault process routine 256 noted in FIG. 9 is illustrated in greater detail in FIG. 12 to which attention is now directed.

In step 550, a fault report is noted and the procedure advances to step 552 during which a determination is made as to whether the noted fault is at the exciter-driver (either exciter EA and driver DA or exciter EB and driver DB). If an internal option of automatic switch mode is noted from step 554, the procedure advances to step 556 during which a determination is made as to whether the fault is in the stand-by exciter. If so, the transmitter is turned off in step 558. Also, if in step 554 a negative decision was made, the transmitter is turned off. However, if in step 556 the determination provided a negative result, the main controller MC mutes both exciters EA and EB in step 560 for 100 milliseconds and then switches to the stand-by exciter (that is, if exciter EA had been providing the RF signal to be amplified, then the stand-by exciter is exciter EB).

If the answer in step 552 is negative, the procedure advances to step 562 during which a determination is made as to whether or not the AC failed. If yes, the procedure advances to the AC restart process described in FIG. 6.

If the AC did not fail, the procedure advances from step 562 to step 567 during which a determination is made as to whether a VSWR fault has taken place. In this determination, the reflected power sample $V_{RF}$ from detector 132 is compared with a reference $V_{R1}$ and if the reflected power sample $V_{RF}$ is greater than $V_{R1}$ the procedure advances to step 576 which is a foldback process. At step 577, a determination is made as to whether the foldback process was successful. If not, the procedure advances to step 568 during which a determination is made as to whether sample $V_{RF}$ is greater than reference $V_{R2}$. If it is, the procedure advances to step 569 during which the "on air" exciter is muted up to three times over a short time interval, such as 30 seconds. If the three-strike process was successful in turning on the transmitter without causing a VSWR fault, the process was successful and this is determined at step 570. If this was unsuccessful, the procedure advances to step 572 during which the transmitter is turned off and not restarted.

VSWR Foldback Process

Figure 13:
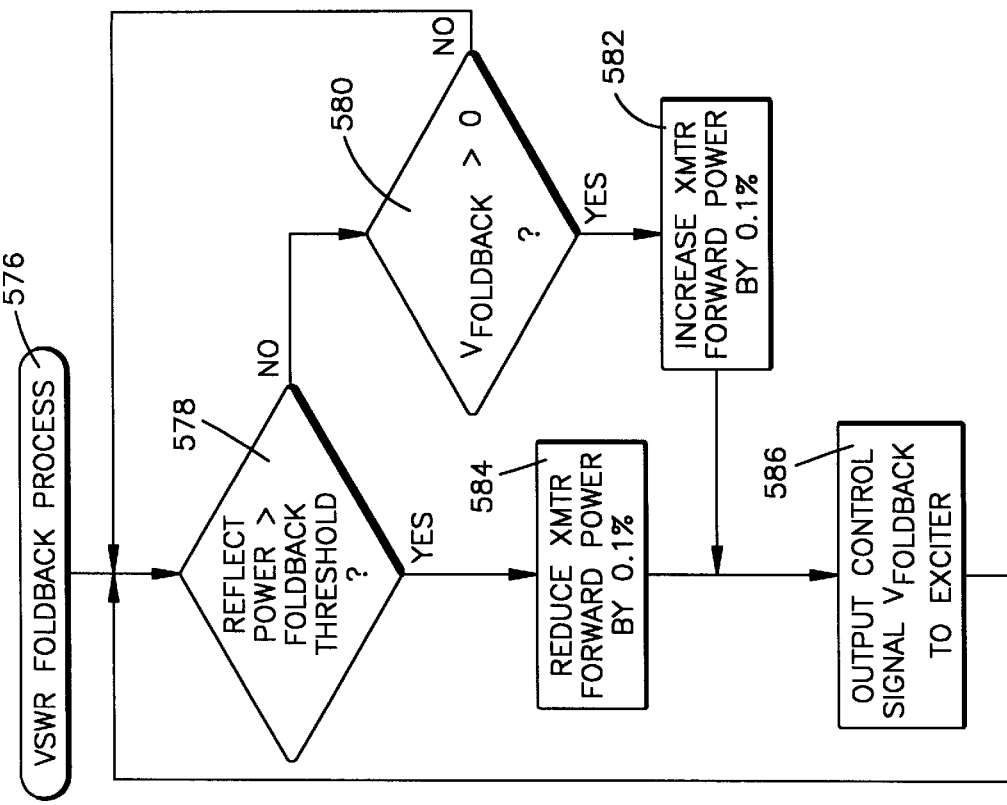
FIG. 13 is a still another flow diagram illustrating another operation of the invention.

The VSWR foldback process 576 is illustrated in FIG. 13 to which attention is now directed. In this procedure a determination is made at step 578 as to whether the reflected power noted by detector 132 is greater than a foldback threshold level. Thus, a determination is made as to whether the reflected power is greater than reference $V_{R1}$ but less than reference $V_{R2}$. If not, the procedure advances to step 580 in which a determination is made as to whether the foldback voltage is greater than 0. If it is, the procedure advances to step 582 during which the transmitter forward power is increased by 0.1% and the procedure advances to step 586.

If the determination in step 578 was positive, the procedure advances to step 584 where the controller reduces the transmitter forward power by 0.1%. Thereafter, the procedure advances to step 586 in which the foldback voltage (increased or decreased) is transmitted to the exciter that is in effect. Then, the procedure advances to step 577 where a determination is made as to whether this foldback routine was successful. If not, the procedure advances to step 568.

Power Amplifier Control Cabinets

Each of the power amplifier control cabinets PAC-1 through PAC-5 is constructed in the manner as described thus far with reference to the power amplifier controller PAC-1 in FIG. 2. Communication with the first central or main control cabinet CC (FIG. 1) takes place over the parallel bus PB and the serial bus SB. The portion of the RF signal to be amplified is received at input terminal 10 and, as described hereinbefore, this signal is split into N portions by the power divider PD-1. These N portions are then supplied to N power amplifier modules PAM-1 through PAM-N.

Figure 14:
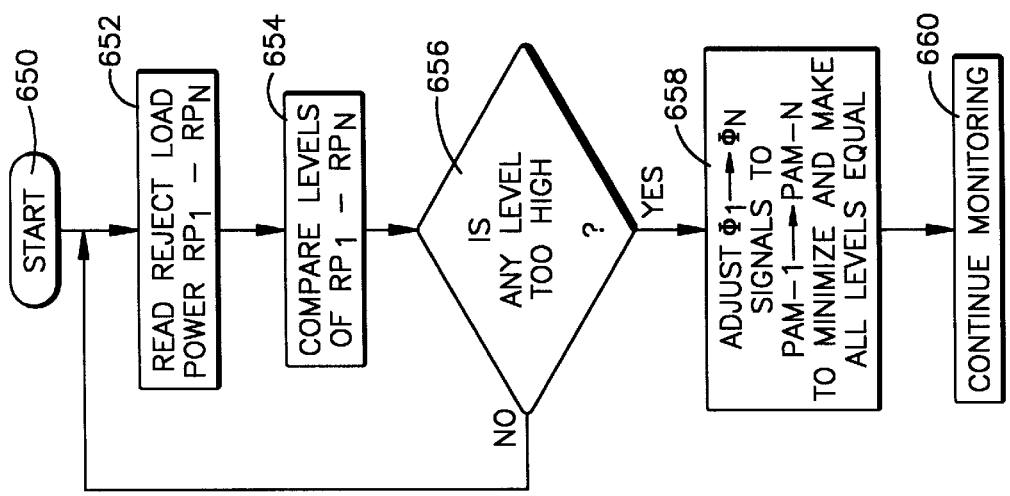
FIG. 14 is a still another flow diagram illustrating another operation of the invention.

The amplified RF signal from each power amplifier module PAM-1 through PAM-N is supplied to the power combiner PC-1. A circulator C-1 through C-N is associated with each circuit. Each circular is connected to a reject load RL-1 through RL-N. The power at these reject loads is detected and supplied to a microprocessor. A coupler 300 is coupled to a power detector 302 which supplies a signal representative of the average reject power $RP_1$ at reject load RL-1. This signal is supplied to the first group controller including microprocessor 305 serving the cabinet PAC-1. Also, a signal coupler 308 is connected to a power detector 310 which supplies a signal representative of the average reject power $RP_N$ at the reject load RL-N to the microprocessor 305. The microprocessor 305 analyzes the reject load power levels and, if necessary, adjusts the phase control signal supplied to the various power amplifier modules. The microprocessor is programmed in accordance with the flow chart of FIG. 14 to which attention is now directed.

This reject load power routine 650 includes a step 652 during which the microprocessor reads the reject load powers $RP_1$ through $RP_N$. The procedure then advances to step 654 during which the microprocessor compares the levels of the reject load powers $RP_1$ through $RP_N$. The procedure then advances to step 656 during which the microprocessor determines whether any of the levels is too high. If the levels are unequal, then the microprocessor adjusts the phase control signals which are supplied to the power amplifier modules PAM-1 through PAM-N. These phase control signals are analog voltages. This is accomplished in step 658 in order to make the levels equal and minimize all reject power. Thereafter, the procedure advances to step 660 during which the microprocessor and the detectors continue their monitoring function.

Reflected Power at the Power Amplifier Controller PAC-1

The power amplifier controller PAC-1 also includes a reflected power detector 370 connected to a signal coupler 372 in the output circuit leading to the load L'. This detector serves to detect the reflected power from the load and provide an output signal $V_{A3}$ which represents the average level of the reflected power. This signal is supplied to the microprocessor 305 which is programmed in accordance with the flow chart of FIG. 15 to which attention is now directed.

Figure 15:
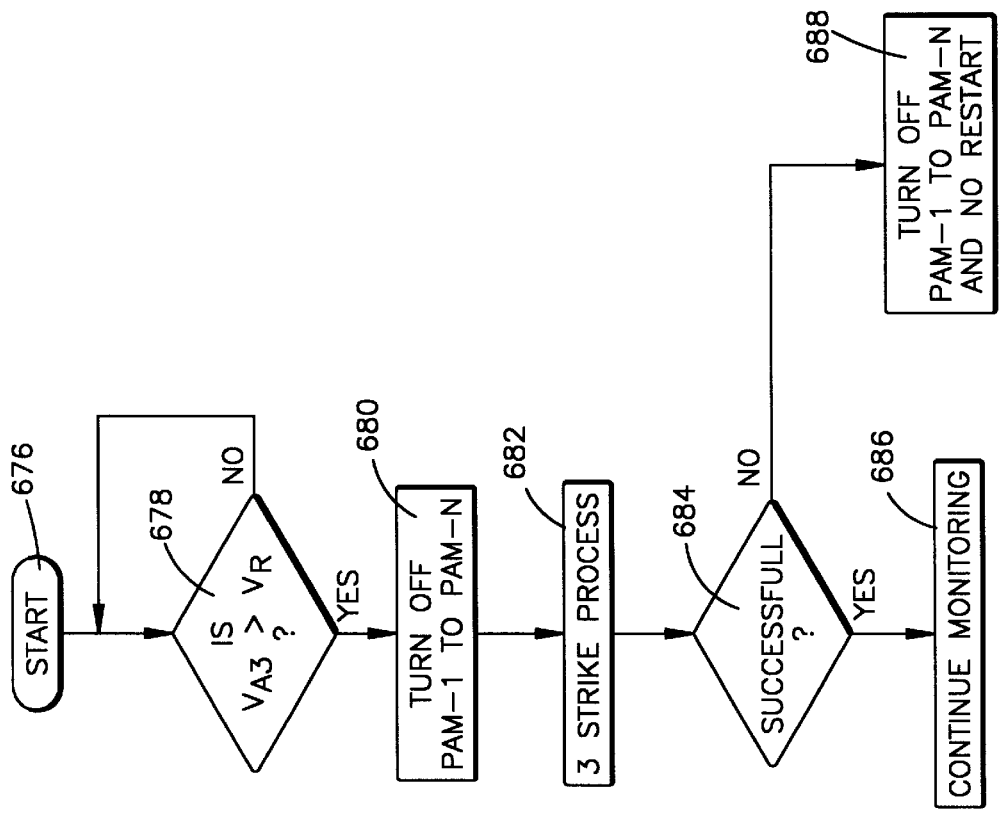
FIG. 15 is a still another flow diagram illustrating another operation of the invention.

FIG. 15 illustrates a flow chart showing the reflected power routine 676. In this routine, a determination is made at step 678 as to whether signal $V_{A3}$ is greater than a reference signal $V_R$. If it is, then in accordance with step 680, the power amplifier modules PAM-1 through PAM-N are turned off. This is accomplished by the microprocessor forwarding an OFF command to each of the power amplifier modules PAM-1 through PAM-N and opening the AC supply switch 51 within the cabinet. Each of the power amplifier modules is turned off by opening the RF switch 14 and the DC switch 22 (FIG. 3).

The procedure then steps to a three-strike process 682 during which the power amplifiers are turned on and the conditions are again monitored to determine if there is a fault condition. The power amplifier is turned on up to three times at within an interval (such as 30 seconds) to determine whether the high reflected power condition is still present.

Thereafter, the procedure advances to step 684 which determines whether the three-strike process has been successful (i.e., whether the reflected power level is acceptable) and, if so, the system continues monitoring as noted in step 686. If the foregoing was not successful, then in accordance with step 688 the power amplifier modules are turned off and not restarted.

Input and Output Power Detectors

Each power amplifier cabinet includes an input average power detector 420 and an output average power detector 422. The input power detector is connected to a signal coupler 424 and provides an output signal representative of the average input power. This output signal is supplied to the microprocessor 305. Similarly, the output power detector is connected to a signal coupler 426 and provides a signal representative of the average output power and this signal is applied to the microprocessor 305. The microprocessor 305 collects data representative of the input power and the output power and forwards the data by the serial bus SB to the control cabinet CC for display at the GUI.

Power Supplies

Each power amplifier cabinet includes an AC supply 450 connected to DC power supplies PS-1 through PS-N by way of a controllable switch 51. When this switch 51 is closed, AC power is supplied to each of the power supplies. These power supplies are AC to DC converters and each provides two DC outputs intended for two power amplifier modules. Thus, the power supply PS-1 is an AC to DC converter and provides the DC voltage $V_{DD}$ (32 volts) to power amplifier modules PAM-1 and PAM-2. Additionally, when switch 51 is closed it supplies AC power to a blower fan 451. Switch 51 may be controlled from various sources including the microprocessor 305 which during a turn ON process closes the switch 51 and during a turn OFF process opens the switch 51. Switch 51 may be operated from other sources as will be described hereinafter.

RS 485 Network

A local serial bus (known as an RS 485 network) interconnects the microprocessor 305 with the power amplifier modules PAM-1 through PAM-N within the power amplifier cabinet. This serial bus provides data which may be viewed on a backup GUI. This backup GUI is an optional graphic user interface and may be located in the power amplifier cabinet or attached thereto.

Fault Sensors

Several fault sensors are associated with the microprocessor 305 and, if a fault is detected by any of these sensors, the transmitter is turned off. These sensors include an air flow fail sensor 460, a cabinet door open sensor 462, a three phase power loss sensor 464 and an AC main fail sensor 466. If any of these sensors detects an associated fault, it supplies a fault signal indicative of the fault to the microprocessor 305 which then turns off the transmitter.

An additional failure sensor 468 is employed by the cabinet life support circuitry for monitoring the operation of the microprocessor 305 for a fault condition. This is discussed below.

Power Amplifier Cabinet Life Support Control

Each power amplifier cabinet PAC-1 through PAC-5 employs a first group controller or microprocessor 305 for controlling the group of power amplifier modules in the cabinet in the manner as described above. Each cabinet also includes a backup control as a second group controller in the event that the microprocessor 305 is not operative.

This backup control includes the second group controller or life support control logic LSC illustrated in FIG. 2 and to which attention is now directed. If the microprocessor 305 fails this is sensed by sensor 468 which provides an output signal indicative of this condition to a pair of AND gates 470 and 472. Another input to the AND gate 470 is taken from an OR gate 474. This OR gate has inputs taken from the failure sensors 460, 462, 464 and 466. An additional input to this OR gate is taken from a local cabinet ON/OFF switch 476, which when off, provides an OFF command signal to the OR gate 474. Any of these failure sensors provides a failure signal or if an OFF command is obtained from switch 476, the OR gate 474 provides an output to the AND gate 470. If the sensor 468 has indicated that the microprocessor 305 has failed, the logic circuit 478 forwards a command to turn off the power amplifier modules PAM-1 through PAM-N. In addition, the logic circuit turns off the AC supply to the power supply units PS-1 through PS-N and to the blower fan 451 by opening switch 51.

When the microprocessor 305 fails this condition enables the AND gate 472 so that the life support controller may control the ON/OFF operation as by way of the parallel bus PB. Consequently, a turn ON command can be routed through this AND gate 472 to turn on the various power amplifiers PAM-1 through PAM-N. In addition, when these power amplifiers are turned on the AC power switch 51 is closed and connects the AC power supply 450 to the power supplies PS-1 through PS-N and to the blower fan 452. Conversely, switch 51 may be opened and power amplifiers PAM-1 through PAM-N may be turned off by this same power OFF operation.

Summation

As has been noted herein, the transmitter can be operated both locally and remotely by either the life support control system or the main control system. The life control system contains all the critical logic to operate and monitor the transmitter. The parallel remote inputs from the remote parallel bus 60 are directly interfaced with the life support controller LS by way of the signal routing provided by the interface IF. The local control panel CP interfaces directly with the life support controller LS. The life support controller provides system level protection and makes the decisions necessary to operate the transmitter in the event that the main controller is rendered inoperable. The life support controller LS forwards basic commands to the exciters EA and EB, the drivers DA and DB as well as to the power amplifier cabinets PAC-1 through PAC-N and also collects data from each of the cabinets. The life support controller may be contained on a circuit board that is hot pluggable.

The main controller MC can operate the transmitter both locally and remotely. Serial remote control is interfaced by way of the GUI or directly to the main controller. The GUI is the local control interface which is directly interfaced to the main controller. The main controller sends commands to the control cabinet components and all other commands to the power amplifier cabinets by way of the CAN serial bus SB. The main controller board is hot pluggable.

Normal operation is active and all the informational data is communicated to the main controller for decision making and display both locally and remotely. The life support controller monitors the main controller and passes all its parallel control and status to the main controller. Both the parallel bus and the serial bus to the power amplifier cabinets are active. If the life support controller detects a failure of the main controller, the life support controller takes over all critical control of decisions. When the life support controller detects that the main controller is operable it will pass control back to the main controller for resumption of normal operations.

The GUI displays all the transmitter information graphically in both block diagram and pictorial form. System configuration, calibration, set up and software upgrading is done by the GUI. Both meter logging and fault logging are part of the GUI.

Each power amplifier cabinet PAC-1 through PAC-5 is a stand alone unit. Each cabinet has redundant low voltage power supplies and AC line feeds. One external input is obtained from the interlock chain (the parallel bus) and the dedicated line for this feature is passive and, hence, does not require that the control cabinet be powered to provide operation. The ON/OFF operation is done at the power amplifier cabinet as with switch 476 (FIG. 2). The power amplifier cabinet is microprocessor based with discrete logic back up (life support controller LSC). The power amplifier cabinet may operate with or without the microprocessor 305. Each power amplifier cabinet receives commands over the serial bus from the main controller and over the parallel bus from the life support controller LC. Additionally, an RS-485 network interconnects the power amplifier modules and the microprocessor in the power amplifier cabinet. A GUI or lap-top computer may be used to interface directly to the microprocessor 305 in the event of a failure of the main controller MC and its serial bus SB to control or monitor or update software in the power amplifier cabinet.

Levels of Redundancy

No Main Control

If the main control fails, the life support control will take over the operation of the transmitter and the transmitter will remain "on the air". Operations may continue using the life support control panel CP (FIG. 1). Additionally, the GUI may be disconnected from the main controller MC and connected one at a time to a power amplifier cabinet PAC-1. Note the backup GUI shown in FIG. 2 herein. Since the main controller is hot pluggable, it may be removed and replaced with a new main controller and operation with the main controller can be restored.

No Life Support

In the event there is no life support control, the main control MC may operate the transmitter in a normal manner as described herein. Since the life support controller LS (FIG. 1) is a hot pluggable, it may be removed and replaced with a new life support control.

No Main Control and Life Support Control

In the event that both the main control and the life support control are non-operative, the transmitter may continue to be "on the air" because the exciters EA and EB and the drivers DA and DB are still on. Consequently, the RF signal is passed through the power amplifier cabinets PAC-1 through PAC-5. The operator should then proceed to each of the power amplifier cabinets and turn ON switch 476 in each cabinet so that an ON command is transmitted to all of the power amplifier modules and the AC power supply switch 51 is closed. In addition, a backup GUI may be connected to the microprocessor in each power amplifier cabinet for monitoring purposes.

No Power Amplifier Cabinet Control

In the event of a failure of the main controller and a failure of the life support controller and that there is no cabinet control at each of the power amplifier cabinets, the transmitter may still remain "on the air" by employing the following procedure. Thus, if the cabinet turn ON switch 476 does nothing, the operator may manually force the AC supply switch 51 to its on condition. This may be done by a jumper wire or the like. This will connect AC power supply to each of the power supplies PS-1 through PS-N so that power is supplied to each of the pulse amplifier modules PAM-1 through PAM-N. This will also turn the blower fan 451 on. The power amplifier modules PAM-1 to PAM-N are fully self-supporting and they contribute to why things are so redundant in this system.

It is also to be noted that each of the power amplifier modules PAM-1 through PAM-N in each power amplifier cabinet is hot pluggable. Consequently, a faulted power amplifier module may be removed and replaced. Also each of the power supply units PS-1 through PS-N are "on air" serviceable and may be removed and replaced. The exciters EA and EB are "on air" serviceable and may be removed and replaced. Also each of the drivers DA and DB are "on air" serviceable and may be removed and replaced. Units that are "on air" serviceable may be removed and replaced by first throwing a breaker switch and then removing and replacing the units.

Whereas the invention has been described in conjunction with the preferred embodiment those skilled in the art will perceive improvements, changes and modifications in the invention. Such improvements, changes and modifications within the skill of the art are intended to be covered by the appended claims.

What is claimed is:

1. An RF power amplifier control system comprising:
    a group of power amplifier modules for amplifying an RF signal;
    said group including first and second group controllers for, when on, controlling the operation of said power amplifier modules including turning on and turning off each of said modules within said group;
    said first group controller normally being on for controlling the amplifier operation and the second group controller is turned on for controlling the operation only when the first controller is turned off;
    first and second central controllers each for, when on, controlling the operation of said first and second group controllers; and,
    said first central controller being normally on to provide said control operation and said second central controller monitors the operation of said first controller and performs said control operation in the event that the first central controller malfunctions.

2. A system as set forth in claim 1 including means for providing an input signal; and,
    at least one exciter for receiving said input signal and providing said RF signal.

3. A system as set forth in claim 1 including means for providing an input signal; and,
    first and second exciters, each for receiving said input signal and providing therefrom an RF signal.

4. A system as set forth in claim 3 including controllable switching means for selecting the RF signal supplied by one of said exciters for amplification by the system.

5. A system as set forth in claim 2 wherein said group includes a plurality of group power detectors for providing group power level signals representative of the power at various locations within said group.

6. A system as set forth in claim 5 wherein said group of power detectors include means for providing a group power level signal representing the reflected power from a load receiving said RF signal from said group; and,
    said first group controller having means for comparing said group reflected power signal with a reference and controlling said power amplifiers modules in said group in accordance with said comparison.

7. A system as set forth in claim 6 wherein said means for controlling said power amplifier modules includes means for turning off the power amplifier modules in said group in response to said reflected power signal exceeding a reference.

8. A system as set forth in claim 7 wherein said means for turning said power amplifier modules off includes means for thereafter turning said power amplifier modules on and then repeating said turning off and turning on of said power amplifier modules a plurality of times over a given time interval to determine whether the reflected power signal exceeding said reference condition continues after repeated turning off and turning on of said power amplifier modules and if so, then turning said power amplifier modules off without turning them on again.

9. A system as set forth in claim 5 wherein said group power detectors include means for providing reject power signals representative of reject load power levels from each of said power amplifier modules, and
    said first group controller having means for comparing said reject power signals to determine if there is an imbalance between said reject power signals and controlling said power amplifier modules in accordance with said determination.

10. A system as set forth in claim 1 wherein said group has at least one fault detector for providing a fault signal in the event of detecting a fault condition and wherein each of said first and second group controllers, when on, is responsive to a said fault signal for turning off all of the power amplifier modules within said group.

11. A system as set forth in claim 10 wherein said detected fault condition is an air flow failure condition.

12. A system as set forth in claim 10 wherein said detected fault condition is a cabinet door open condition.

13. A system as set forth in claim 10 wherein said detected fault condition is a three-phase loss.

14. A system as set forth in claim 10 wherein said detected fault condition is an AC main power loss.

15. A system as set forth in claim 1 wherein said group includes AC to DC power supply means for supplying DC voltage to each of said power amplifier modules and controllable AC switching means for, when on, connecting said power supply means with an AC supply source.

16. A system as set forth in claim 15 wherein said group includes a manually operable master switch means for supplying a turn on signal for turning on said AC switching means.

17. A system as set forth in claim 10 wherein said group has a group controller failure detector for providing a failure signal in response to detecting failure of said first group controller; and,
    means responsive to said failure signal for turning on said second group controller.

18. A system as set forth in claim 2 wherein said group includes a group signal splitter and a signal combiner and wherein said power amplifier modules are interconnected between said group signal splitter and said group signal combiner.

19. A system as set forth in claim 2 wherein said system has a plurality of said groups of power amplifier modules and said system includes a plurality of system power detectors for providing system power level signals representative of the power at various locations within said system.

20. A system as set forth in claim 19 wherein said system power detectors include means for providing a system reflected power level signal representing the reflected power from a load receiving the RF signal from said system; and,
    wherein one of said central controllers includes means for comparing said system reflected power signal with a reference and controlling said power amplifier modules in said system in accordance therewith.

21. A system as set forth in claim 20 wherein said means for controlling said power amplifier modules includes means for muting said exciter in said system in response to said reflected power signal exceeding said reference.

22. A system as set forth in claim 21 wherein said means for muting said exciter includes means for thereafter unmuting said exciter and then repeating said muting and unmuting of said exciter a plurality of times over a given time interval to determine whether the reflected power signal exceeding said reference continues after repeated muting and unmuting of said exciter.

23. A system as set forth in claim 4 including means for determining whether the exciter that provides the selected RF signal is operating properly and if not, then determining whether the exciter is the first exciter and if so then muting both exciters and switching to the second exciter and then removing the muting of the second exciter.

24. A system as set forth in claim 1 including means for determining whether an AC supply source for the system is operating properly and if not then determining whether the AC power supply had returned within a predetermined timed interval and then turning off all of the power amplifier modules.

25. A system as set forth in claim 1 wherein said first central controller includes programmed computing means which is programmed to perform said control operations.

26. A system as set forth in claim 2 wherein each said power amplifier module has computing means including means for receiving and sending data and for storing data;
    each said first group controller has computing means including means for receiving and sending data and for storing data; and,
    said first central controller has computing means including means for receiving and sending data and storing data and wherein said system includes a data bus interconnecting all of said computing means for communicating data therebetween.

27. A system as set forth in claim 26 wherein said computing means in said first central controller includes means for requesting data from any of said other computing means in said power amplifier modules and in said first group controller and receiving requested data therefrom.

28. A system as set forth in claim 27 wherein said computing means in said first central controller includes means for storing received requested data.

29. A system as set forth in claim 28 wherein said computing means in said first central controller includes means for receiving data from data sources other than said other computing means.

30. A system as set forth in claim 29 wherein said computing means in said first central controller includes data decoding means for decoding received data and means for determining whether said decoded data includes command data representing functional commands and, if so, initiating operation in response to such commands.

31. A system as set forth in claim 29 including means for determining whether said received data represents calibration information and if so performing the requested calibration and storing the same.

32. A system as set forth in claim 2 wherein said first central controller includes means for determining whether said exciter has malfunctioned and, if so, initiating operation for turning off said power amplifier modules.

33. A system as set forth in claim 4 wherein said first central controller includes means for determining whether one of said first and second exciters has failed and, if so, controlling said controllable switching means for selecting the RF signal supplied by the other of said first and second exciters.

34. A system as set forth in claim 19 wherein one of said central controllers is a first controller and wherein said first controller includes means for determining whether said reflected power signal is greater than a second threshold and, if so, reducing the forward power by applying a control signal to said exciter.

35. A radio frequency transmitter system and control system therefor comprising:
    a plurality of power amplifier cabinets connected in parallel between a system splitter and a system combiner, an input circuit adapted to receive signals to be transmitted coupled to the system splitter, an output circuit coupled to the system combiner, and detectors for detecting a plurality of various power levels of the power amplifier cabinets and input and output signals;
    the power amplifier cabinets each including a plurality of power amplifier modules connected in parallel between a cabinet splitter receiving input signals from the system splitter and a cabinet combiner providing output signals to the system combiner, and detectors for detecting a plurality of various power levels of the power amplifier modules and the input and output signals;
    the power amplifier modules each including at least one power amplifier stage receiving input signals from the cabinet splitter and providing output signals to the cabinet combiner, and detectors for detecting the power levels of the input and output signals;
    a power amplifier module control system including a module control circuit receiving the detected module power level signals for identifying faults in the detected module power level signals for controlling the operation of the module in response to faults;

a power amplifier cabinet control system including a main cabinet control circuit receiving the detected cabinet power level signals for identifying faults in the detected power level signals for controlling the operation of the plurality of modules in response to faults and a secondary cabinet control circuit for detecting a fault in the main cabinet control circuit for assuming the control of the operation of the plurality of modules;

a power amplifier system control system including a main system control circuit receiving the detected system power level signals for identifying faults in the detected system power level signals for controlling the operation of the plurality of cabinets in response to faults and a secondary system control circuit for detecting a fault in the system main control circuit for assuming the control of the operation of the plurality of cabinets, and circuit means for communicating the fault status of the detected power levels of the cabinet control circuits to the system control circuits.

36. A radio frequency transmitter system and control system therefor as define in claim 35 wherein:

the system detectors monitor system output power, system reflected output power and system power output imbalance;

the cabinet detectors monitor cabinet output power, cabinet reflected output power and cabinet power output imbalance, and the module detectors monitor module input power and module output power.

37. A radio frequency transmitter system and control system therefor as defined in claim 36 wherein:

the module control system is adapted to control the operation of the power amplifier module as a function of monitored module power levels;

the cabinet control systems are adapted to control the operation of individual power amplifier modules as a function of monitored cabinet power levels, and the system control systems are adapted to control the operation of individual power amplifier cabinets as a function of monitored system power levels.

38. A radio frequency transmitter system and control system therefor as defined in claim 37 wherein:

the cabinet control systems are adapted to control the gain of the power amplifier modules in response to certain monitored cabinet power levels, and to inhibit the operation of module power amplifiers in response to other monitored cabinet power level faults.

39. A radio frequency transmitter system and control system therefor as defined in claim 37 wherein:

the system control systems are adapted to control the gain of the power amplifier cabinets in response to certain monitored cabinet power levels, and to inhibit the operation of the transmitter system in response to other monitored power level faults.

40. A radio frequency transmitter system and control system therefor as defined in claim 37 wherein:

the module control system is adapted to control the processing of the input signal to the power amplifier module in response to certain monitored power levels.

41. A radio frequency transmitter system and control system therefor as defined in claim 37 wherein:

the cabinet control systems are responsive to the detection of cabinet output reflected power level beyond a threshold to inhibit the operation of the power amplifier modules and reactivate the power amplifier modules a plurality of times prior to inhibiting the operation of the power amplifier modules if the reflected power level has not dropped below the threshold level.

42. A radio frequency transmitter system comprising:

a plurality of primary amplifier stages connected in parallel wherein each of the primary amplifier stages include a plurality of second level amplifier stages connected in parallel and wherein each of the plurality of second level amplifier stages includes at least one third level amplifier stage and wherein the plurality of second level amplifier outputs are combined to form the primary level output;

power level monitor circuits included in each of the primary, second level and third level amplifier stages for monitoring the input and output power levels of the respective amplifier stages;

main control circuits for the primary level, second level and third level amplifier stages receiving power level signals from their respective power level monitor circuits for controlling the operation of the respective amplifier stages as a function of the power level signals received;

back up control circuits for the primary and second level power amplifies stages for monitoring the operation of the respective main control circuits to assume control in the event that a malfunction is detected in associated main control circuit, and a communication circuit for communicating said power level signals to the control circuits of the primary amplifier stage.

43. A radio frequency transmitter system as defined in claim 42 wherein:

the power level monitor circuits of the primary amplifier stages monitor average input power, average output power, reflected output power and power output imbalance;

the power level monitor circuits of the second level amplifier stages monitor average input power, average output power, reflected output power and power output imbalance; and, the power level monitor circuits of the third level amplifier stage monitor the average input power and the average output power.

44. A radio frequency transmitter system as defined in claim 43 wherein:

the control circuit for the third level amplifier stage is adapted to control the gain or phase of the input signal to the third level amplifier stage in response to certain monitored power levels.

45. A radio frequency transmitter system as defined in claim 44 wherein:

the control circuits for the second level amplifier stages are adapted to control the gain of the second level amplifier stages in response to certain monitored power levels and to inhibit the operation of the second level amplifier stages in response to other monitored power levels.

46. A radio frequency transmitter system as defined in claim 45 wherein:

the control circuits of the primary amplifier stages are adapted to control the gain of the primary amplifier stage in response to certain monitored power levels and to inhibit the operation of the primary level amplifier stages in response to other monitored power levels.

47. An RF power amplifier control system comprising:

a group of power amplifier modules for amplifying an RF signal;

said group including first and second group controllers for, when on, controlling the operation of said power amplifier modules including turning on and turning off each of said modules within said group; and, said first group controller normally being on for controlling the amplifier operation and the second group controller is turned on for controlling the operation only when the first controller is turned off.

48. A system as set forth in claim 47 including means for providing an input signal; and, at least one exciter for receiving said input signal and providing said RF signal.

49. A system as set forth in claim 47 including means for providing an input signal; and, first and second exciters, each for receiving said input signal and providing therefrom an RF signal.

50. A system as set forth in claim 49 including a controllable switch that selects the RF signal supplied by one of said exciters for amplification by the system.

51. A system as set forth in claim 48 wherein said group includes a plurality of group power detectors providing group power level signals representative of the power at various locations within said group.

52. A system as set forth in claim 51 wherein said group of power detectors includes a power detector that provides a group power level signal representing the reflected power from a load receiving said RF signal from said group; and, said first group controller compares said group reflected power signal with a reference and controls said power amplifiers modules in said group in accordance with said comparison.

53. A system as set forth in claim 52 wherein said controller controls said power amplifier modules by turning off the power amplifier modules in said group in response to said reflected power signal exceeding a reference.

54. A system as set forth in claim 53 wherein said controller turns said power amplifier modules off and thereafter turns said power amplifier modules on and then repeats said turning off and turning on of said power amplifier modules a plurality of times over a given time interval to determine whether the reflected power signal exceeding said reference condition continues after repeated turning off and turning on of said power amplifier modules and if so, then turning said power amplifier modules off without turning them on again.

55. A system as set forth in claim 54 wherein said group power detectors include power detectors that provide reject power signals representative of reject load power levels form each of said power amplifier modules, and said first group controller compares said reject power signals to determine if there is an imbalance between said reject power signals and controls said power amplifier modules in accordance with said determination.

56. A system as set forth in claim 47 wherein said group has at least one fault detector for providing a fault signal in the event of detecting a fault condition and wherein each of said first and second group controllers, when on, is responsive to a said fault signal for turning off all of the power amplifier modules within said group.

57. A system as set forth in claim 56 wherein said detected fault condition is an air flow failure condition.

58. A system as set forth in claim 56 wherein said detected fault condition is a cabinet door open condition.

59. A system as set forth in claim 56 wherein said detected fault condition is a three-phase loss.

60. A system as set forth in claim 56 wherein said detected fault condition is an AC main power loss.

61. A system as set forth in claim 47 wherein said group includes AC to DC power supply that supplies DC voltage to each of said power amplifier modules and a controllable AC switch for, when on, connecting said power supply means with an AC supply source.

62. A system as set forth in claim 61 wherein said group includes a manually operable master switch for supplying a turn on signal for turning on said AC switch.

63. A system as set forth in claim 56 wherein said group has a group controller failure detector for providing a failure signal in response to detecting failure of said first group controller; and, means responsive to said failure signal for turning on said second group controller.

64. A system as set forth in claim 48 wherein said group includes a group signal splitter and a signal combiner and wherein said power amplifier modules are interconnected between said group signal splitter and said group signal combiner.

* * * * *

UNITED STATES PATENT AND TRADEMARK OFFICE
CERTIFICATE OF CORRECTION

PATENT NO.   : 6,124,758
DATED        : September 26, 2000
INVENTOR(S)  : Theodore H. Korte, Jeffery M. Malec, Zhiqun Hu, Carlos, Abascal and James P. Keller It is certified that error appears in the above-identified patent and that said Letters Patent is hereby corrected as shown below:

Column 22,
Line 3, change "54" to -- 51 --

Signed and Sealed this

Twenty-third Day of October, 2001

Attest:

NICHOLAS P. GODICI
Acting Director of the United States Patent and Trademark Office Attesting Officer